United States Patent
Seki et al.

(10) Patent No.: US 10,714,498 B2
(45) Date of Patent: Jul. 14, 2020

(54) SEMICONDUCTOR MEMORY DEVICE

(71) Applicant: Toshiba Memory Corporation, Minato-ku (JP)

(72) Inventors: Harumi Seki, Kawasaki (JP); Yuichiro Mitani, Yokkaichi (JP); Takamitsu Ishihara, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/294,150

(22) Filed: Mar. 6, 2019

(65) Prior Publication Data

US 2020/0091180 A1  Mar. 19, 2020

(30) Foreign Application Priority Data

Sep. 14, 2018  (JP) .................................. 2018-172766

(51) Int. Cl.

| | | |
|---|---|---|
| *H01L 27/11582* | (2017.01) | |
| *H01L 27/1157* | (2017.01) | |
| *G11C 8/14* | (2006.01) | |
| *H01L 23/522* | (2006.01) | |
| *H01L 27/11565* | (2017.01) | |
| *H01L 27/11563* | (2017.01) | |

(52) U.S. Cl.
CPC ......... *H01L 27/11582* (2013.01); *G11C 8/14* (2013.01); *H01L 23/5226* (2013.01); *H01L 27/1157* (2013.01); *H01L 27/11563* (2013.01); *H01L 27/11565* (2013.01)

(58) Field of Classification Search
CPC .................... H01L 27/11563; H01L 27/11578
See application file for complete search history.

(56) References Cited

U.S. PATENT DOCUMENTS

| | | | |
|---|---|---|---|
| 6,674,426 B1 * | 1/2004 | McGee | ................... G06F 3/038 |
| | | | 178/18.01 |
| 7,052,941 B2 | 5/2006 | Lee | |
| 8,637,914 B2 | 1/2014 | Sakui | |
| 9,831,118 B1 | 11/2017 | Pang et al. | |
| 9,837,434 B2 * | 12/2017 | Sakata | ................ H01L 27/1157 |
| 10,243,000 B2 * | 3/2019 | Sohn | ................. H01L 27/11524 |
| 2012/0211820 A1 | 8/2012 | Komori et al. | |
| 2018/0097011 A1 | 4/2018 | Sakata et al. | |

FOREIGN PATENT DOCUMENTS

| | | |
|---|---|---|
| JP | 2011-165972 | 8/2011 |
| JP | 2012-174887 | 9/2012 |
| JP | 5202842 | 6/2013 |

* cited by examiner

*Primary Examiner* — Jose R Diaz
(74) *Attorney, Agent, or Firm* — Oblon, McClelland, Maier & Neustadt, L.L.P.

(57) ABSTRACT

According to one embodiment, a semiconductor memory device includes: a first interconnect layer; a second interconnect layer adjacent to the first interconnect layer; a semiconductor layer between the first and second interconnect layers; a first charge storage layer between the first interconnect layer and the semiconductor layer; and a second charge storage layer between the second interconnect layer and the semiconductor layer. A first distance between the first and second interconnect layers is shorter than a second distance between the first and second charge storage layers.

17 Claims, 31 Drawing Sheets

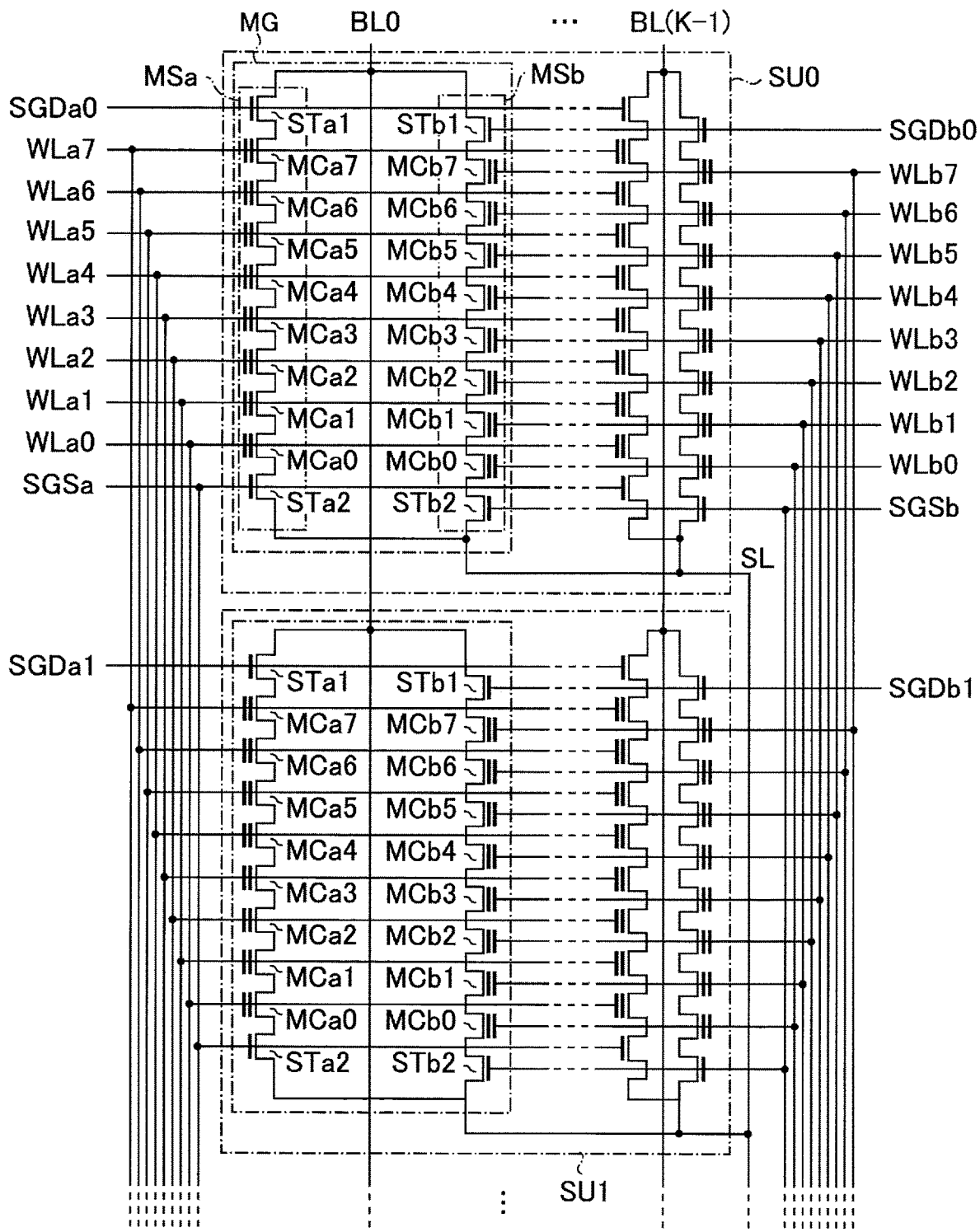
F I G. 2

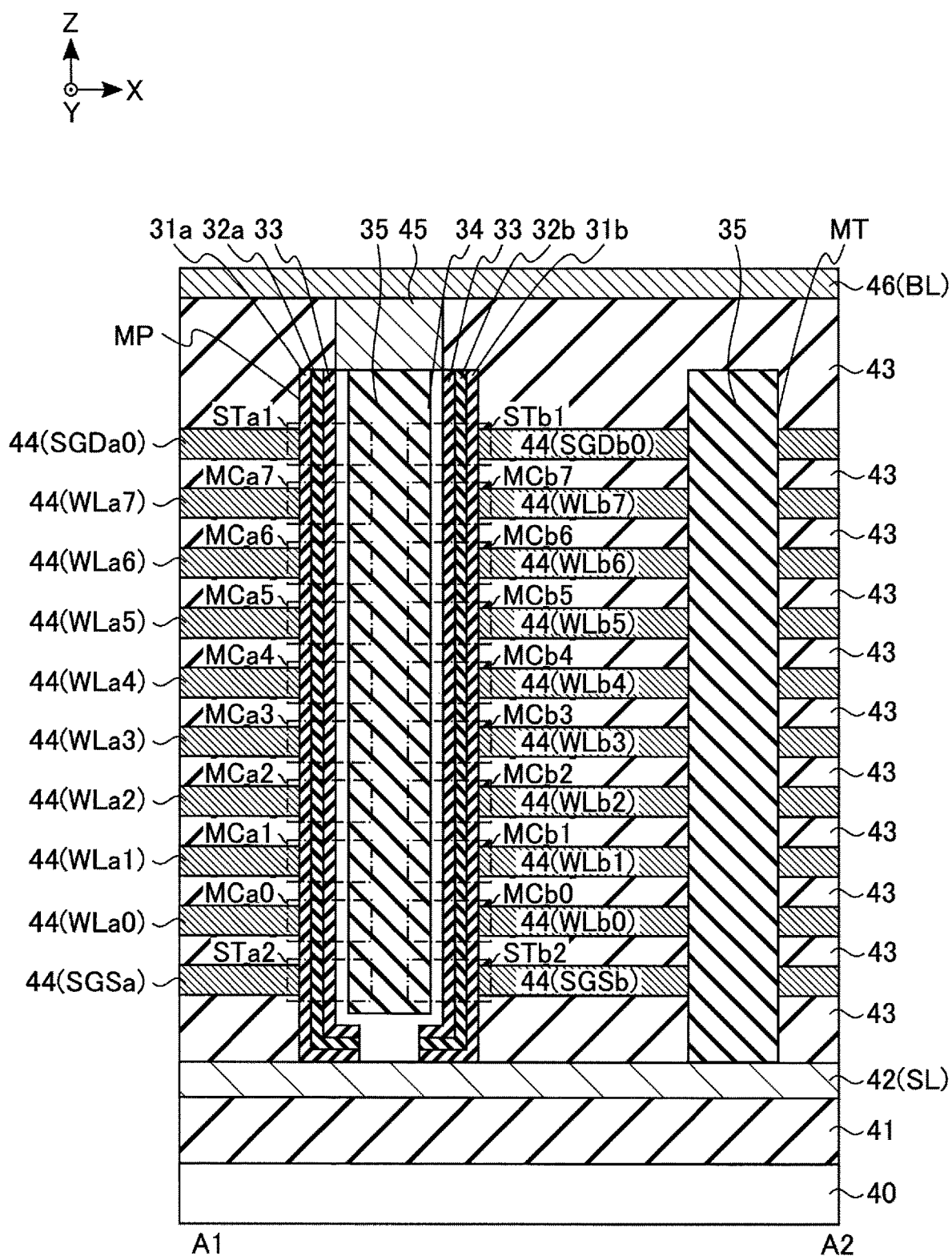
F I G. 4

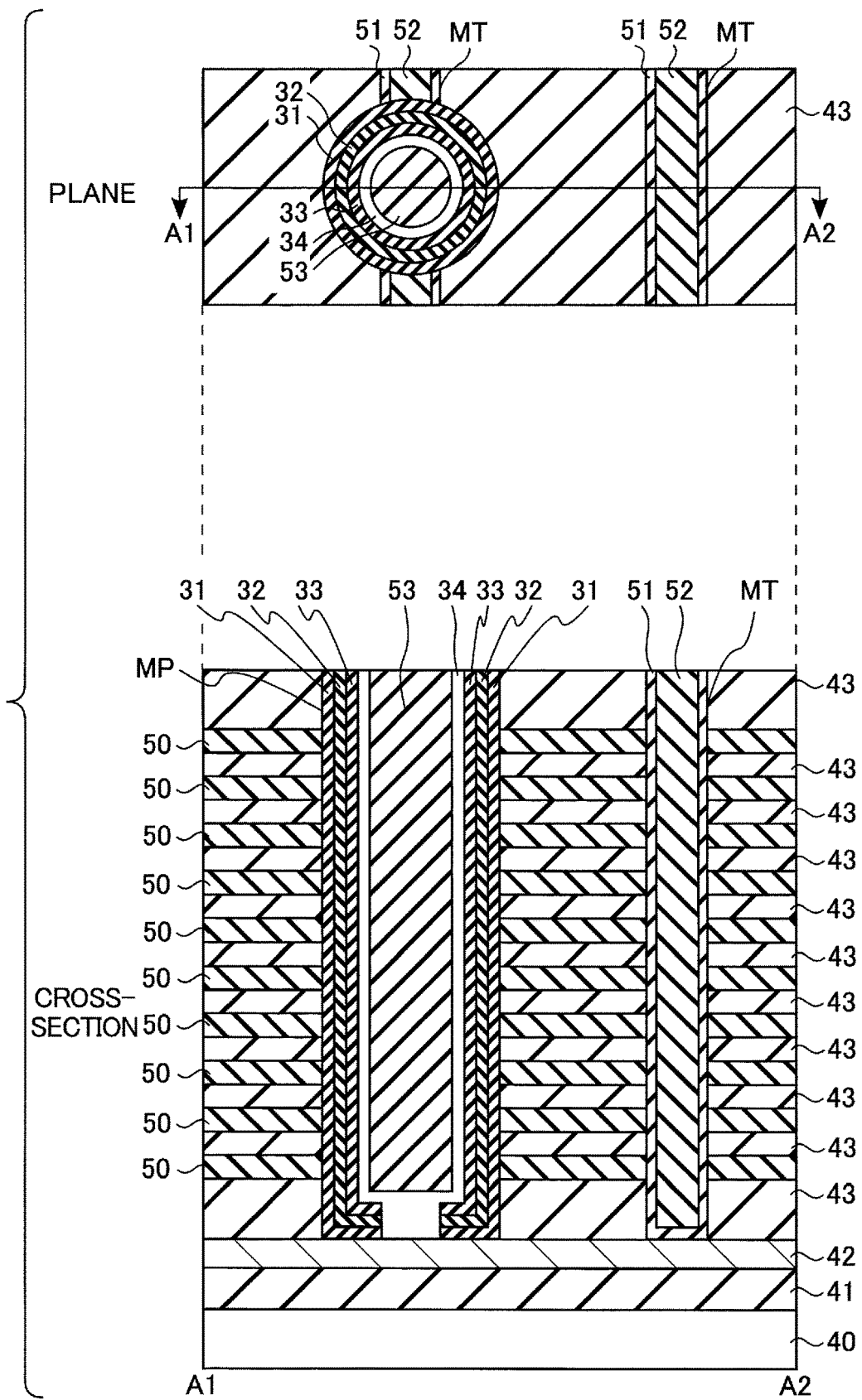
F I G. 9

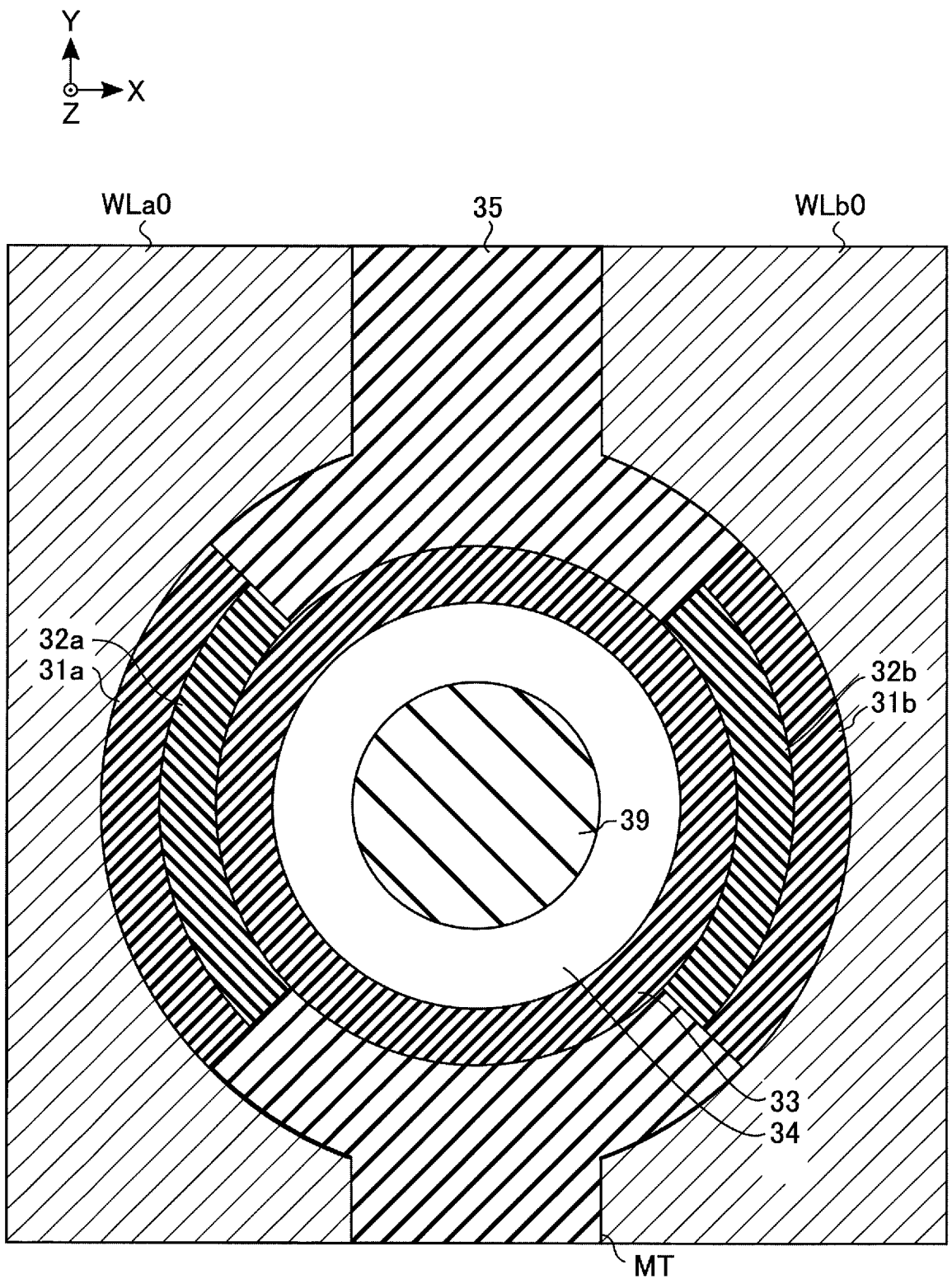
F I G. 18

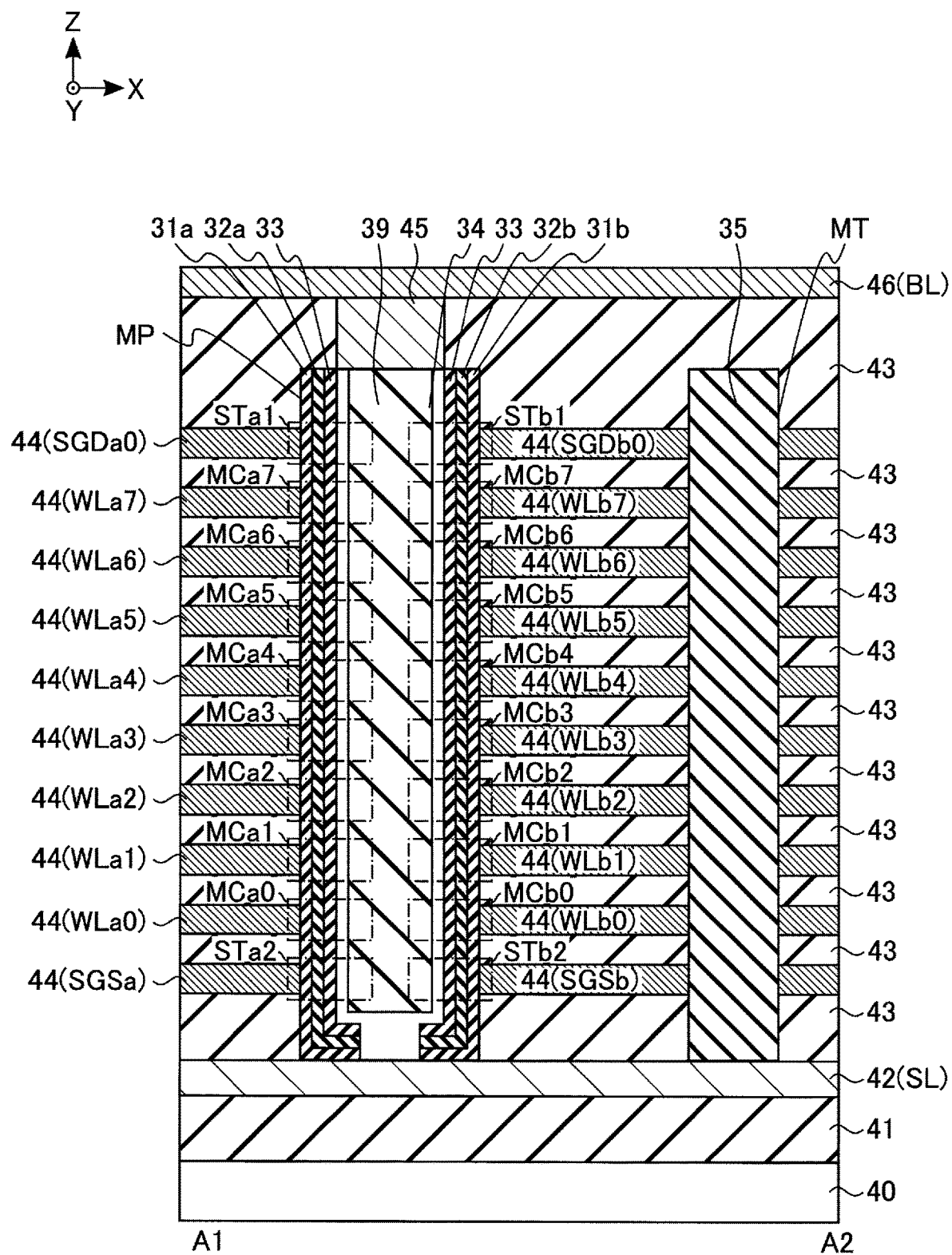
F I G. 19

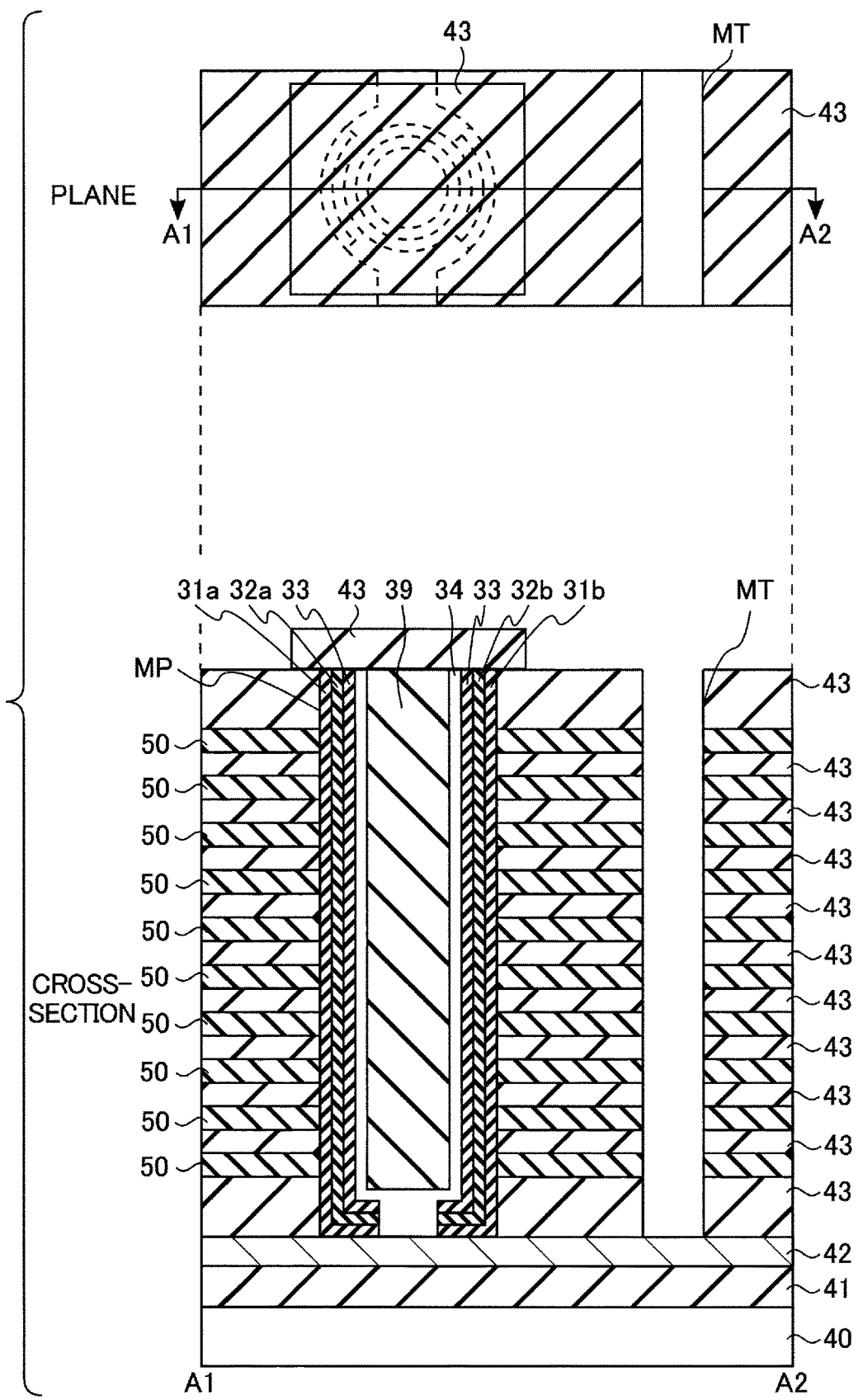
F I G. 23

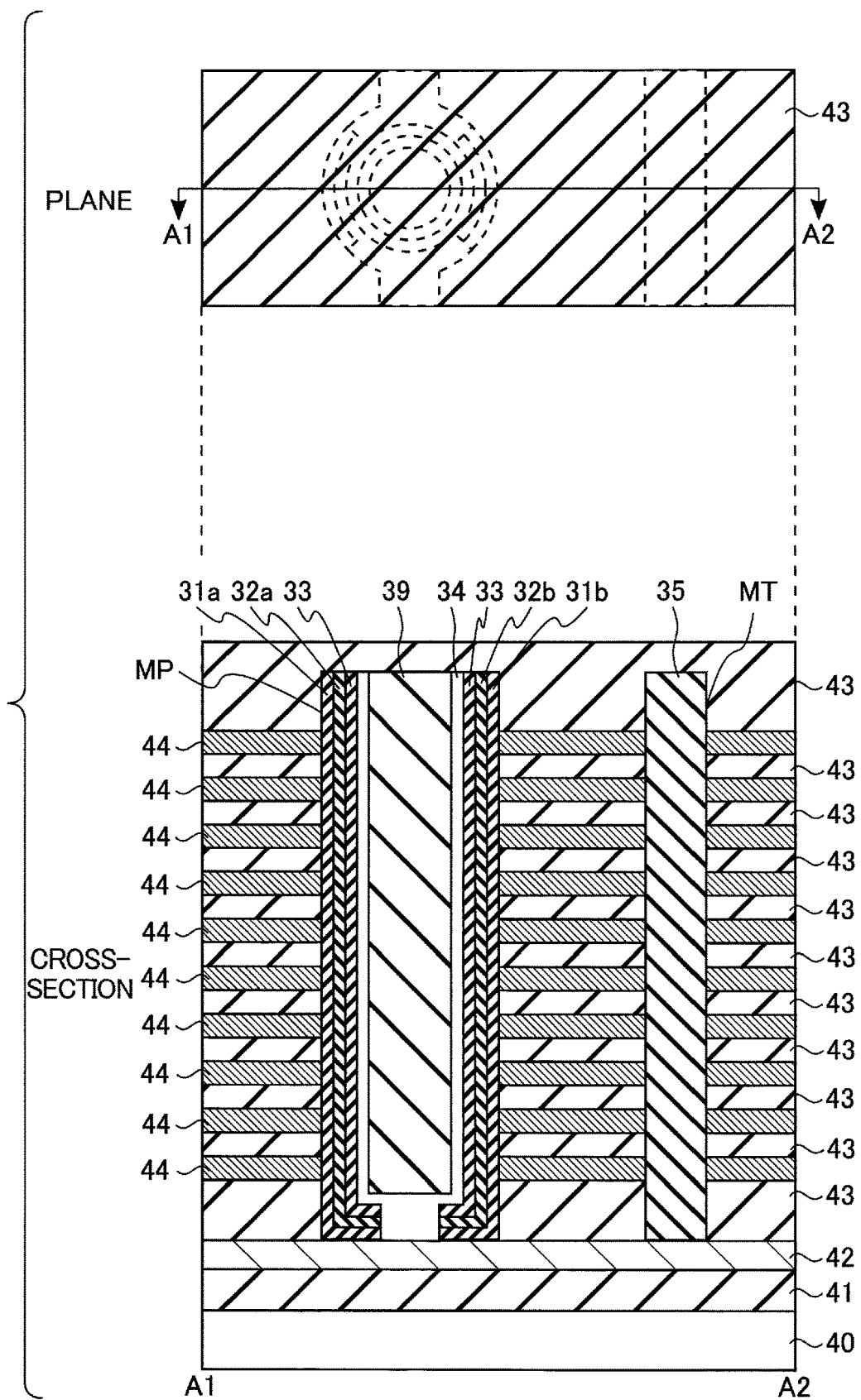
F I G. 25

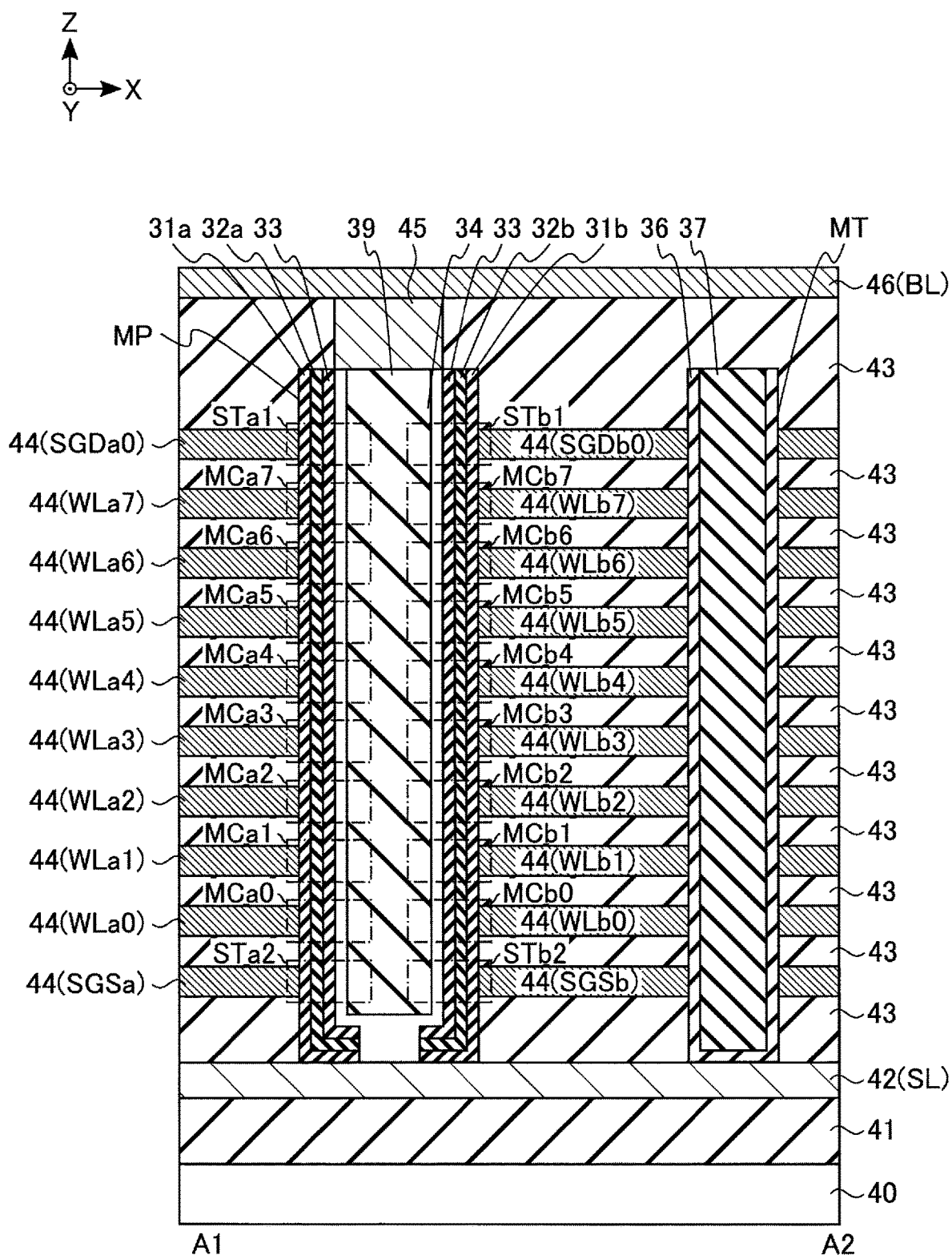
F I G. 27

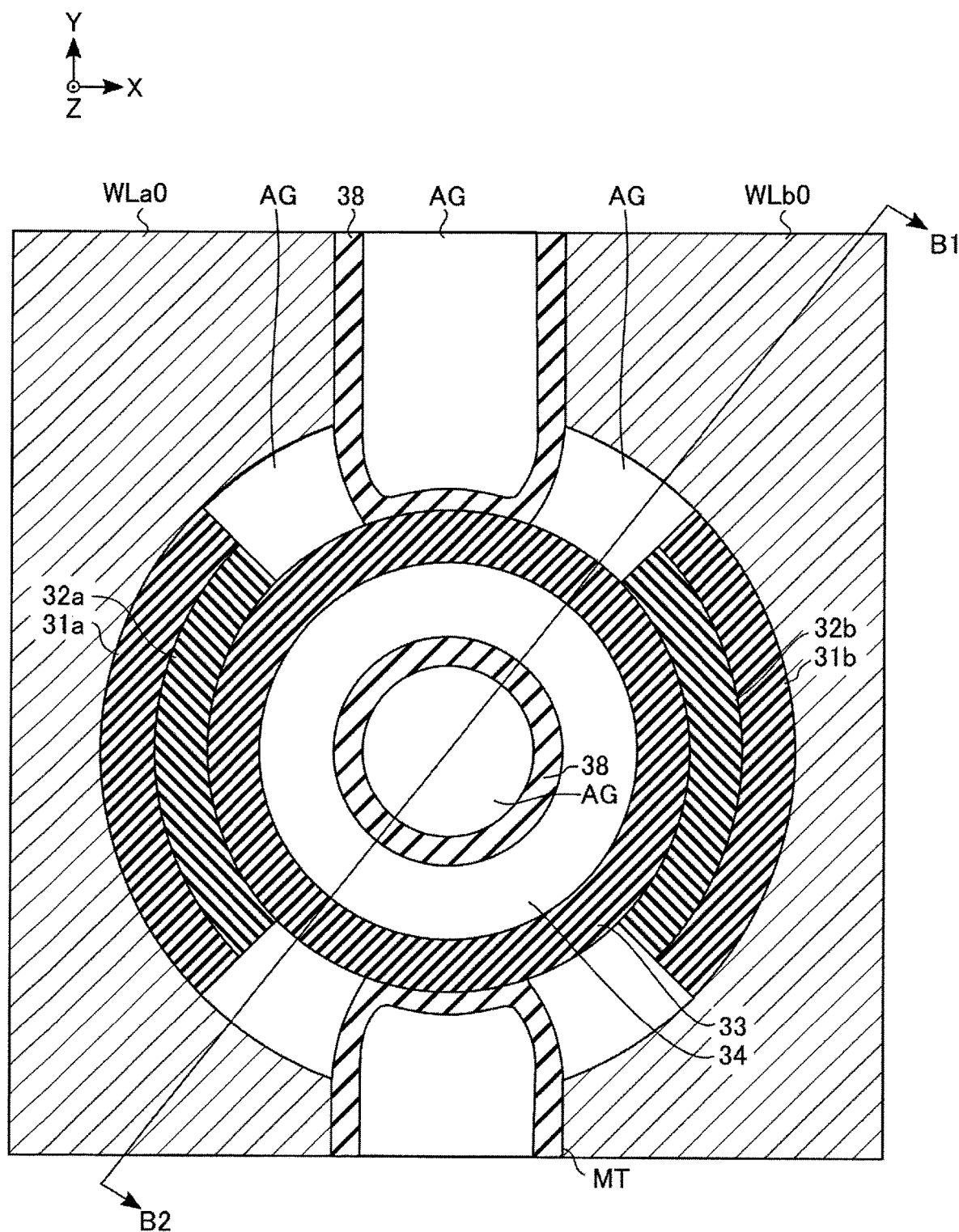
F I G. 30

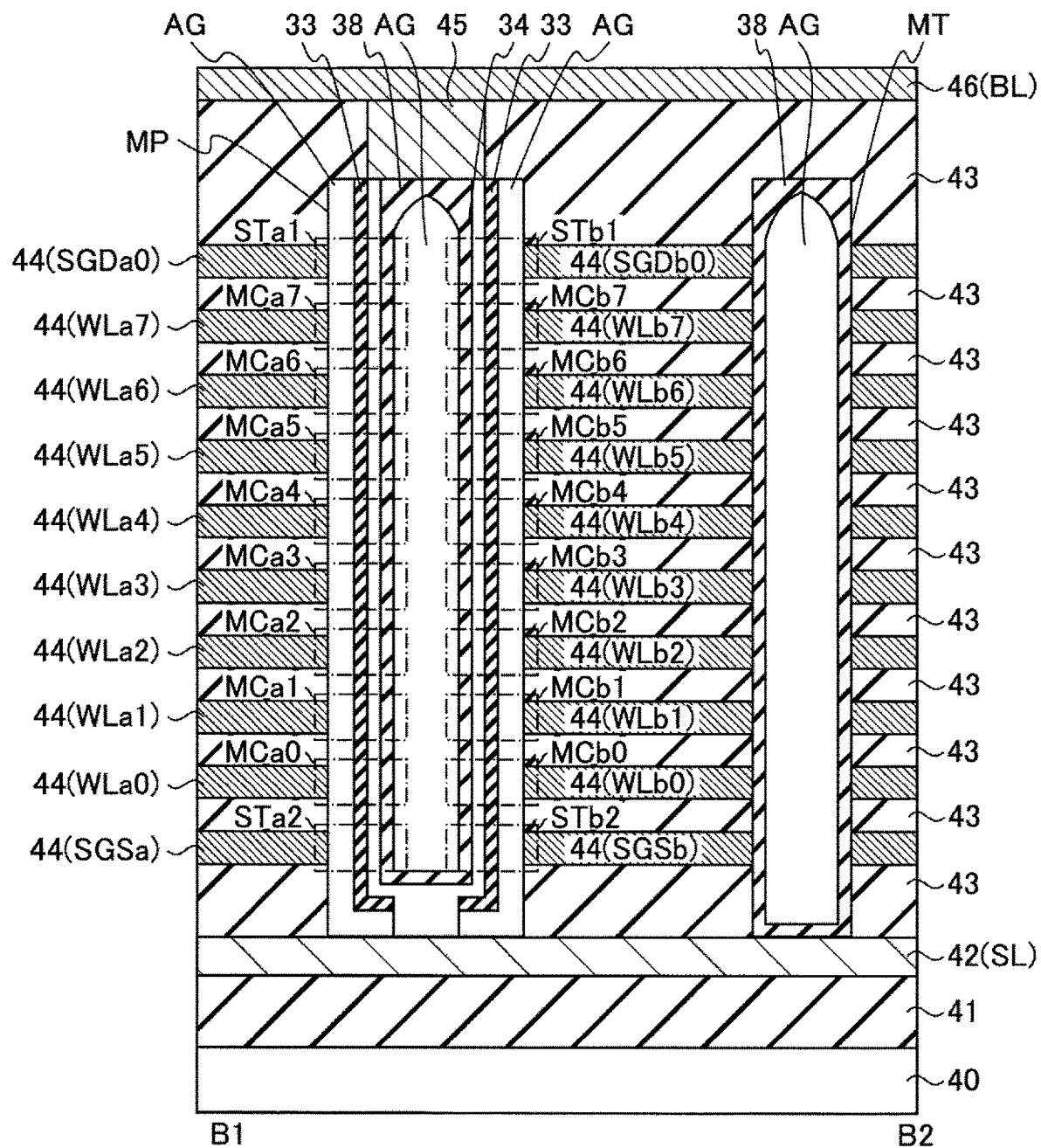
F I G. 31

SEMICONDUCTOR MEMORY DEVICE

CROSS-REFERENCE TO RELATED APPLICATIONS

This application is based upon and claims the benefit of priority from Japanese Patent Application No. 2018-172766, filed Sep. 14, 2018, the entire contents of which are incorporated herein by reference.

FIELD

Embodiments described herein relate generally to a semiconductor memory device.

BACKGROUND

A NAND-type flash memory is known as a semiconductor memory device.

BRIEF DESCRIPTION OF THE DRAWINGS

FIG. 2 is a circuit diagram of the memory cell array in the semiconductor memory device according to the first embodiment;

FIG. 4 is a cross-sectional view of the memory cell array along the Z direction in the semiconductor memory device according to the first embodiment;

FIG. 9 is a diagram showing a process of manufacturing the memory cell array in the semiconductor memory device according to the first embodiment;

FIG. 18 is a cross-sectional view of the memory pillar in the XY plane in the semiconductor memory device according to the third embodiment;

FIG. 19 is a cross-sectional view of the memory cell array along the Z direction in the semiconductor memory device according to the third embodiment;

FIG. 23 is a diagram showing a process of manufacturing the memory cell array in the semiconductor memory device according to the third embodiment;

FIG. 25 is a diagram showing a process of manufacturing the memory cell array in the semiconductor memory device according to the third embodiment;

FIG. 27 is a cross-sectional view of the memory cell array along the Z direction in the semiconductor memory device according to the first example of the fourth embodiment;

FIG. 30 is a cross-sectional view of the memory pillar in the XY plane in the semiconductor memory device according to a modification; and FIG. 31 is a cross-sectional view of the memory cell array along the Z direction in the semiconductor memory device according to the modification.

DETAILED DESCRIPTION

In general, according to one embodiment, a semiconductor memory device includes: a first interconnect layer extending in a first direction; a second interconnect layer provided to be adjacent to the first interconnect layer in a second direction intersecting with the first direction, and extending in the first direction; a semiconductor layer provided between the first interconnect layer and the second interconnect layer, and extending in a third direction intersecting with the first direction and the second direction; a first charge storage layer provided between the first interconnect layer and the semiconductor layer in the second direction; and a second charge storage layer provided between the second interconnect layer and the semiconductor layer in the second direction. A first distance between the first interconnect layer and the second interconnect layer in the second direction is shorter than a second distance between the first charge storage layer and the second charge storage layer in the second direction.

1. First Embodiment

A semiconductor memory device according to the first embodiment will be described. In the following, as a semiconductor memory device, a three-dimensionally stacked NAND flash memory with memory cell transistors stacked on a semiconductor substrate will be described by way of example.

1.1 Configuration

1.1.1 Overall Configuration of Semiconductor Memory Device

Figure 1:
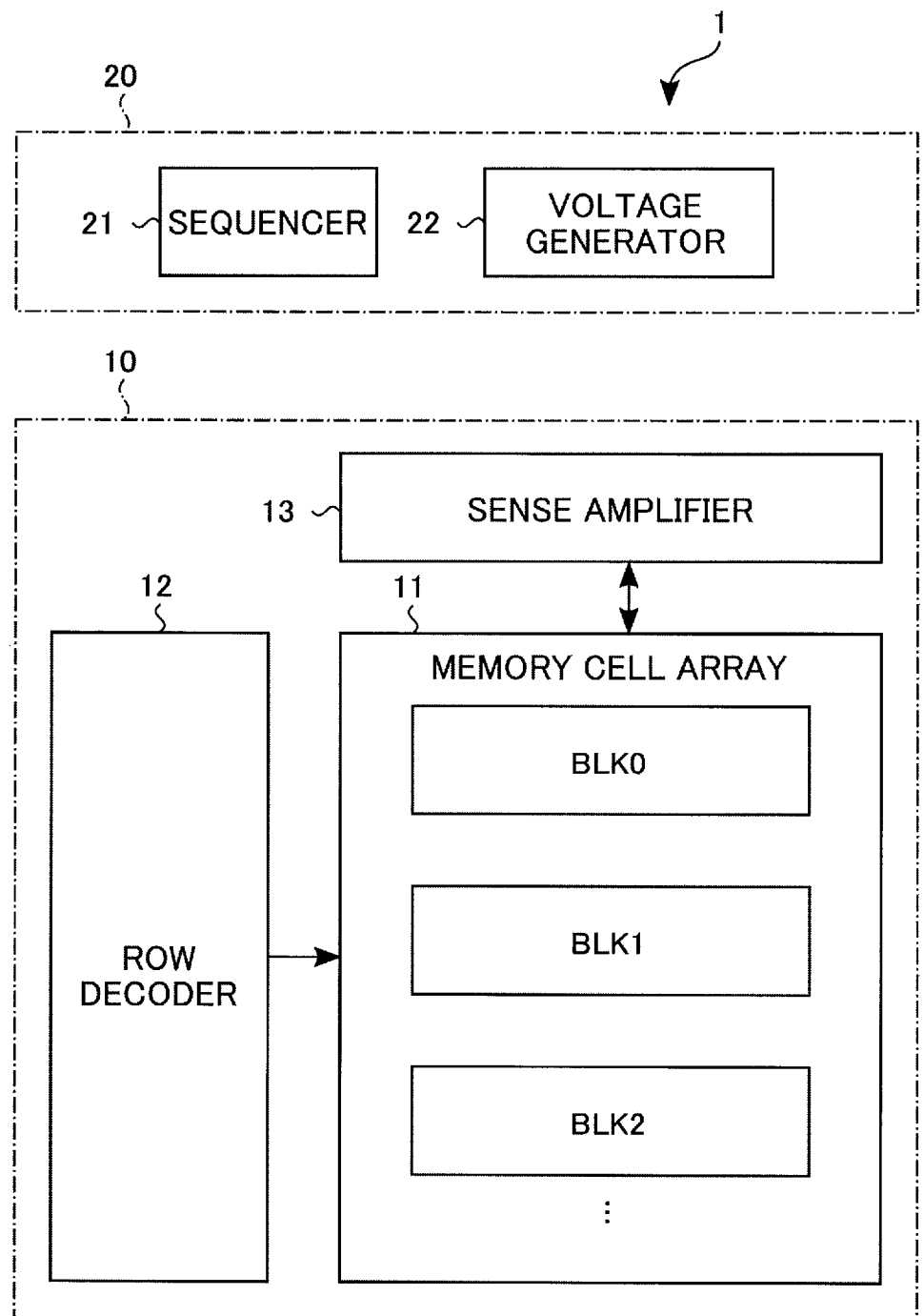
FIG. 1 is a block diagram of the semiconductor memory device according to the first embodiment.

First, an overall configuration of a semiconductor memory device will be described with reference to FIG. 1. FIG. 1 is an example of a block diagram showing a basic overall configuration of the semiconductor memory device. In FIG. 1, a part of a coupling between blocks is indicated by arrows, but the coupling between blocks is not limited to these.

As shown in FIG. 1, the semiconductor memory device 1 roughly includes a memory core part 10, and peripheral circuitry 20.

The memory core part 10 includes a memory cell array 11, a row decoder 12, and a sense amplifier 13.

The memory cell array 11 includes a plurality of blocks BLK (BLK0, BLK1, BLK2, . . . ). The number of blocks BLK may be any number. The block BLK includes a plurality of memory cell transistors associated with rows and columns and three-dimensionally stacked.

The row decoder 12 decodes a row address received from an external controller (not shown). Then, the row decoder 12 selects a row direction of the memory cell array 11 based on a result of the decoding. More specifically, the row decoder 12 applies voltages to interconnects for selecting a row direction.

When a data read is performed, the sense amplifier 13 senses data read from any of the blocks BLK when a data read is performed. When a data write is performed, the sense amplifier 13 applies a voltage to the memory cell array 11 in accordance with write data. The peripheral circuitry 20 includes a sequencer 21 and a voltage generator 22.

The sequencer 21 controls the entire operation of the semiconductor memory device 1. More specifically, the sequencer 21 controls the voltage generator 22, the row decoder 12, the sense amplifier 13, etc., when a write operation, a read operation, or an erase operation is performed.

The voltage generator 22 generates voltages required for the write operation, the read operation, and the erase operation, and supplies the generated voltages to the row decoder 12, the sense amplifier 13, etc.

1.1.2 Circuitry Configuration of Memory Cell Array

Next, the circuitry configuration of the memory cell array 11 will be described with reference to FIG. 2. FIG. 2 is a circuit diagram of the memory cell array 11 in one block BLK.

As shown in FIG. 2, a block BLK includes a plurality of string units SU (SU0, SU1 . . . ). The number of string units SU in the block BLK may be any number. Each string unit SU includes a plurality of memory groups MG. Each memory group MG includes two memory strings MSa and MSb. Hereinafter, memory strings MSa and MSb will be referred to as memory strings MS unless otherwise specified.

Memory string MSa includes, for example, eight memory cell transistors MCa (MCa0 through MCa7), and select transistors STa1 and STa2. Similarly, memory string MSb includes, for example, eight memory cell transistors MCb (MCb0 through MCb7), and select transistors STb1 and STb2. Hereinafter, memory cell transistors MCa0 through MCa7 and MCb0 through MCb7 will be referred to as memory cell transistors MC unless otherwise specified. In addition, memory cell transistors MCa0 and MCb0 will be referred to as memory cell transistors MC0 unless otherwise specified. The same applies to other memory cell transistors MC1 to MC7. Moreover, select transistors STa1 and STb1 will be referred to as select transistors ST1 unless otherwise specified, and select transistors STa2 and STb2 will be referred to as select transistors ST2 unless otherwise specified.

Each memory cell transistor MC includes a control gate and a charge accumulation layer, and non-volatilely holds data. The memory cell transistors MC may be of a MONOS type using insulating layers for charge storage layers, or an FG type using conductive layers for charge storage layers. In the following, in the present embodiment, the MONOS-type transistors will be described by way of example. The number of memory cell transistors MC included in each of memory strings MS may be 16, 32, 48, 64, 96, 128, and so on, and the number is not limited. The number of select transistors ST1 and ST2 included in each of memory strings MS may be any number, and may be one or more.

The memory cell transistors MC and the select transistors ST1 and ST2 included in each memory string MS are coupled in series. More specifically, in memory string MSa, the current paths of select transistor STa2, memory cell transistors MCa0 through MCa7, and select transistor STa1 are coupled in series in order. Similarly, in memory string MSb, the current paths of select transistor STb2, memory cell transistors MCb0 through MCb7, and select transistor STb1 are coupled in series in order. The drains of select transistor STa1 and select transistor STb1 included in one memory group MG are coupled in common to any of a plurality of bit lines BL (BL0, . . . , BL(K−1) where (K−1) is an integer equal to or greater than 2). The plurality of bit lines BL are independently controlled by the sense amplifier 13. The sources of select transistor STa2 and select transistor STb2 included in each memory group MG in block BLK are coupled in common to source line SL.

In the string unit SU, the gates of the plurality of select transistors STa1 are coupled in common to select gate line SGDa, and the gates of the plurality of select transistors STb1 are coupled in common to select gate line SGDb. More specifically, in string unit SU0, the gates of the plurality of select transistors STa1 are coupled in common to select gate line SGDa0, and the gates of the plurality of select transistors STb1 are coupled in common to select gate line SGDb0. Similarly, in string unit SU1, the gates of the plurality of select transistors STa1 are coupled in common to select gate line SGDa1, and the gates of the plurality of select transistors STb1 are coupled in common to select gate line SGDb1.

In the block BLK, the gates of the plurality of the select transistors STa2 are coupled in common to select gate line SGSa, and the gates of a plurality of the select transistors STb2 are coupled in common to select gate line SGSb. Select gate lines SGSa and SGSb may be provided in each string unit SU.

Hereinafter, select gate lines SGDa (SGDa0, SGDa1, . . . ) and SGDb (SGDb0, SGDb1, . . . ) will be referred to as select gate lines SGD unless otherwise specified, and select gate lines SGSa and SGSb will be referred to as select gate lines SGS unless otherwise specified.

In each block BLK, the control gates of the plurality of memory cell transistors MCa0 through MCa7 and MCb0 through MCb7 are respectively coupled in common to word lines WLa0 through WLa7 and WLb0 through WLb7 provided in each block BLK. Hereinafter, word lines WLa and WLb will be referred to as word lines WL unless otherwise specified. In addition, for example, word lines WLa0 and WLb0 will be referred to as word lines WL0 unless otherwise specified. The same applies to other word lines WL1 to WL7.

Each of select gate lines SGD and SGS and each of word lines WL are independently controlled by the row decoder 12.

A block BLK is a unit for data erasing, for example, and data stored in memory cell transistors MC included in the same block BLK can be erased together. The write operation and the read operation are performed together on the plurality of memory cell transistors MC coupled in common to one of the word lines WL in one of the string units SU.

In the memory cell array 11, the plurality of memory groups MG arranged in the same row are coupled to one bit line BL in common. In other words, the memory groups MG of respective string units SU are coupled to a bit line BL in common between a plurality of string units SU of a plurality of blocks BLK. The string unit SU includes a plurality of memory groups MG coupled to different bit lines BL and coupled to the same select gate line SGD. In addition, the block BLK includes a plurality of string units SU sharing word lines WL. The memory cell array 11 includes a plurality of blocks BLK sharing bit lines BL. In the memory cell array 11, the select gate lines SGS, the word lines WL, and the select gate lines SGD are stacked above the semiconductor substrate; accordingly, the memory cell transistors MC are three-dimensionally stacked.

1.1.3 Planar Configuration of Memory Cell Array

Figure 3:
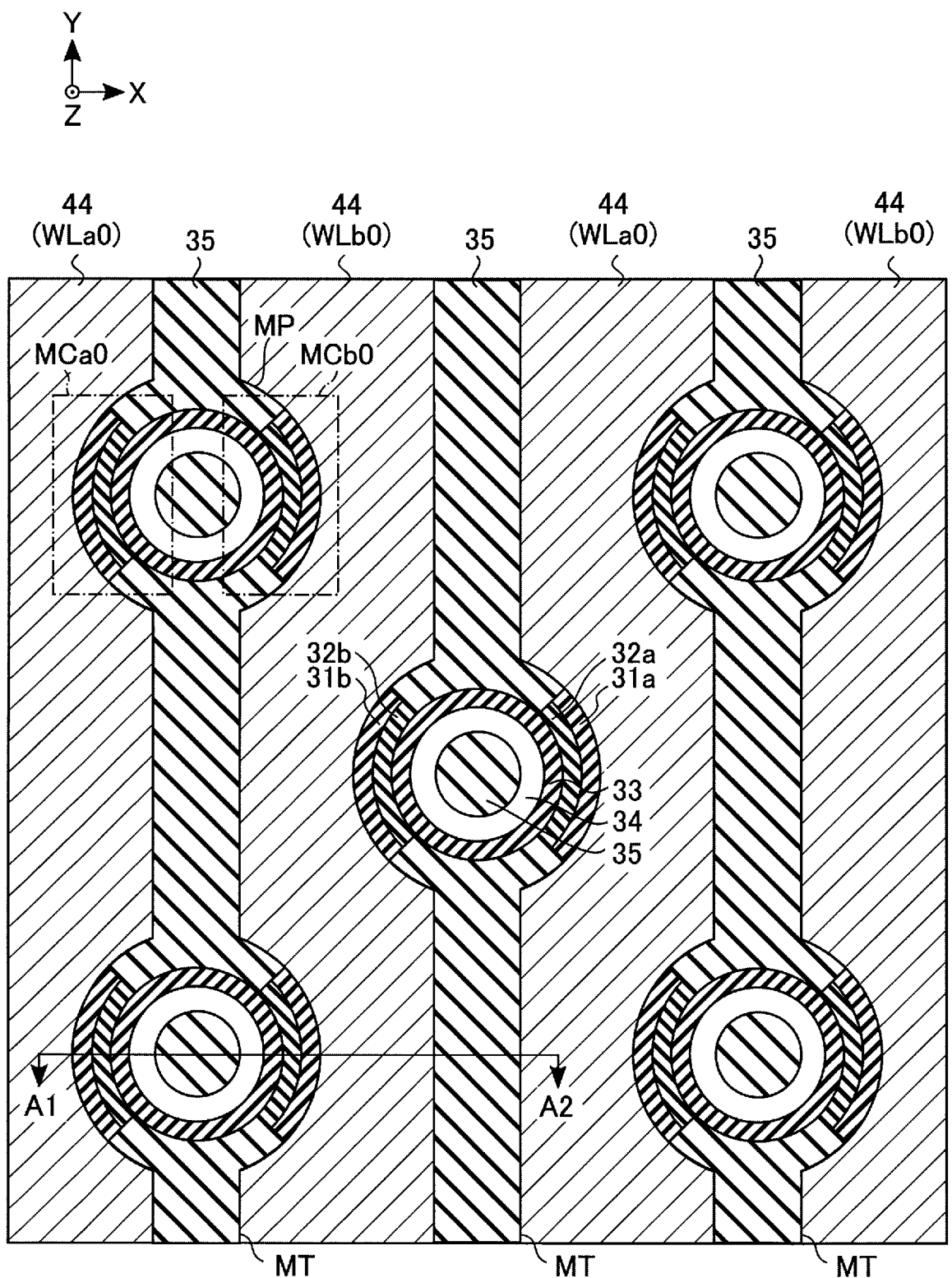
FIG. 3 is a top view of word lines WL in the memory cell array in the semiconductor memory device according to the first embodiment.

Next, a planar configuration of the memory cell array 11 will be described with reference to FIG. 3. The example of FIG. 3 shows a planar layout of word lines WLa0 and WLb0 of block BLK0.

As shown in FIG. 4, a plurality of interconnect layers 44 that extend in a Y direction parallel to the semiconductor substrate are arranged along an X direction parallel to the semiconductor and orthogonal to the Y direction. More specifically, the interconnect layers 44 function as word lines WLa0 and WLb0. The interconnect layers 44 functioning as word line WLa0 and the interconnect layers 44 functioning as word line WLb0 are alternately arranged to be adjacent along the X direction.

The interconnect layers 44 adjacent in the X direction in the block BLK are separated by a memory trench MT extending in the Y direction. For example, the memory trench MT is filled with an insulating layer 35. Other word lines WL and select gate lines SGD and SGS (not shown) are separated by the memory trench MT in a similar manner.

In addition, between the interconnect layers 44, a plurality of memory pillars MP each extending along the Z direction perpendicular to the semiconductor substrate are arranged in, for example, a staggered manner. One memory pillar MP corresponds to one memory string MSa and one memory string MSb.

The memory pillar MP includes block insulating films 31a and 31b, charge storage layers 32a and 32b, a tunnel insulating film 33, a semiconductor layer 34, and a core layer (referred to as a core area as well). More specifically, in the side surface of the memory pillar MP, the block insulating film 31a that is in contact with word line WLa0, and the block insulating film 31b that is in contact with word line WLb0 are provided to extend in the Z direction. The charge storage layer 32a that is in contact with the block insulating film 31a and the charge storage layer 32b that is in contact with the block insulating film 31b are provided to extend in the Z direction. The tunnel insulating film 33 whose outer peripheral side surface is in contact with the charge storage layers 32a and 32b is provided to extend in the Z direction. The semiconductor layer 34 whose outer peripheral surface is in contact with the inner peripheral side surface of the tunnel insulating film 33 is provided to extend in the Z direction. The core layer (e.g., insulating layer 35) whose side surface is in contact with the inner peripheral side surface of the semiconductor layer 34 is provided to extend in the Z direction.

The block insulating films 31 (31a and 31b) and the charge storage layers 32 (32a and 32b) are each divided into two in the X direction by the memory trench MT. The memory trench MT is divided into a plural in the Y direction by the tunnel insulating film 33, the semiconductor layer 34, and the core layer.

In the memory pillar MP provided between word line WLa0 and word line WLb0, an area, including a part of word line WLa0 and a part of the memory pillar MP (the block insulating layer 31a, the charge storage layer 32a, the tunnel insulating film 33, and the semiconductor layer 34) that is in contact with word line WLa0, functions as memory cell transistor MCa0, i.e., one storage. Similarly, an area, including a part of word line WLb0 and a part of the memory pillar MP (the block insulating layer 31b, the charge storage layer 32b, the tunnel insulating film 33, and the semiconductor layer 34) that is in contact with word line WLb0, functions as memory cell transistor MCb0. Thus, in one memory pillar MP, two memory cell transistors MC are provided on the same layer. The same applies to other word lines WL and select gate lines SGD and SGS.

1.1.4 Cross-Sectional Configuration of Memory Cell Array

Next, a cross-sectional configuration of the memory cell array 11 will be described with reference to FIG. 4. FIG. 4 is a cross-sectional view of the memory cell array 11 taken along line A1-A2 of FIG. 3.

As illustrated in FIG. 4, an insulating layer 41 is formed on a semiconductor substrate 40. For the insulating layer 41, for example, a silicon oxide ($SiO_2$) film is used. On the insulating layer 41, an interconnect layer 42 functioning as source line SL is formed. The interconnect layer 42 is made of a conductive material, an example of which includes an n-type semiconductor to which impurities are added, or a metallic material, etc.

A circuit such as the row decoder 12 or the sense amplifier 13, etc. may be provided in an area where the insulating layer 41 is formed, i.e., between the semiconductor substrate 40 and the interconnect layer 42.

On the interconnect layer 42, an insulating layer 43 is formed, and on the insulating layer 43, interconnect layers 44, functioning as select gate lines SGS, word lines WL0 to WL7, and select gate lines SGD, are sequentially stacked with a plurality of insulating layers 43 interposed so that they are separated in the Z direction. On the topmost interconnect layer 44, an insulating layer 43 is further stacked. Namely, eleven insulating layers 43 and ten interconnect layers 44 are alternately stacked on the interconnect layer 42.

For the insulating layer 43, for example, $SiO_2$ is used. The interconnect layer 44 is made of a conductive material, an example of which includes an n-type semiconductor or p-type semiconductor to which impurities are added, or a metallic material. For the interconnect layer 44, a stacked structure of titanium nitride (TiN)/tungsten (W) is used. TiN functions as a barrier layer to prevent a reaction of W and $SiO_2$, or functions as an adhesion layer to improve adhesiveness of W, when W is formed by chemical vapor deposition (CVD), for example.

The memory trench MT extending in the Y direction is formed in such a manner that the memory trench MT passes through the plurality of interconnect layers 44 and insulating layers 43, and is in contact with the interconnect layer 42 at its bottom surface. The memory trench MT separates the interconnect layers 44 in the X direction. The inside of the memory trench MT is filled with the insulating layer 35, for example.

The memory pillar MP is formed in such a manner that the memory pillar MP passes through the plurality of interconnect layers 44 and insulating layers 43 and reaches the interconnect layer 42 with its bottom surface. In the example of FIG. 4, the block insulating film 31a and the charge storage layer 32a are sequentially stacked on the side surface at the left side of the memory pillar MP in the drawing sheet. Similarly, the block insulating film 31b and the charge storage layer 32b are sequentially stacked on the side surface at the right side of the memory pillar MP in the drawing sheet. The tunnel insulating film 33 is formed in such a manner that its side surfaces are in contact with the charge storage layers 32a and 32b. The semiconductor layer 34 is formed in such a manner that its side surfaces are in contact with the tunnel insulating film 33 and its bottom surface is in contact with the interconnect layer 42. The semiconductor layer 34 is a region where channels of the memory cell transistor MC and select transistors ST1 and ST2 are formed. Thus, the semiconductor layer 34 functions as, in memory string MS, a signal line coupling the current paths of select transistor ST2, memory cell transistors MC0 through MC7, and select transistor ST1. Inside the semiconductor layer 34, for example, the insulating layer 35 is formed as a core layer.

For the block insulating films 31 (31a and 31b), for example, $SiO_2$, aluminum oxide ($Al_2O_3$), or a laminated film thereof is used. In the following embodiment, a description will be given based on the case where $Al_2O_3$ is used. For the charge storage layers 32 (32a and 32b), for example, a silicon nitride (SiN) film is used. For the tunnel insulating film 33, for example, $SiO_2$, a laminated film of $SiO_2$/SiN, a laminated film of $SiO_2$/SiN/$SiO_2$, or a silicon nitride (SiON) film is used. In the following, a description will be given based on the case where $SiO_2$ is used for the tunnel insulating film 33. For the semiconductor layer 34, for example, polysilicon is used.

For the insulating layer 35, an insulating material having a relative dielectric constant lower than that of the charge storage layers 32 (32a and 32b) is used. For example, when SiN is used for the charge storage layer 32, the insulating layer 35 may be $SiO_2$, SiOF, SiOC, SiON, SiCN, or SiC having a relative dielectric constant lower than that of SiN, or a laminated film thereof, etc. In the following, a description will be given based on the case where spin on glass (SOG) is used for the insulating layer 35 as $SiO_2$ which has excellent fill-in properties. As a coating material of SOG, a material containing polysilazane may be used.

On the memory pillar MP, a contact plug 45 is formed so that a part of the bottom surface is in contact with the semiconductor layer 34, and an interconnect layer 46 functioning as a bit line BL is provided so as to be in contact with the upper surface of the contact plug 45. The contact plug 45 and the interconnect layer 46 are made of a conductive material, an example of which includes a stacked structure of titanium (Ti)/TiN/W, for example.

In the example of FIG. 4, the interconnect layer 44 on the lowermost layer that is in contact with the left side of the memory pillar MP in the drawing sheet functions as select gate SGSa, the eight interconnect layers 44 provided above the lowermost layer function as word lines WLa0 to WLa7, and the interconnect layer 44 on the uppermost layer functions as select gate line SGDa. Similarly, the interconnect layer 44 on the lowermost layer that is in contact with the right side of the memory pillar MP in the drawing sheet functions as select gate SGSb, the eight interconnect layers 44 provided above the lowermost layer function as word lines WLb0 to WLb7, and the interconnect layer 44 on the uppermost layer functions as select gate line SGDb.

Thus, the memory pillar MP and the eight interconnect layers 44 functioning as word lines WLa0 to WLa7 provided at the left side of the memory pillar MP in the drawing sheet constitute memory cell transistors MCa0 through MCa7, respectively. The memory pillar MP and the interconnect layer 44 functioning as select gate line SGSa provided at the left side of the memory pillar MP in the drawing sheet constitute select transistor STa2. The memory pillar MP and the interconnect layer 44 functioning as select gate line SGDa provided at the left side of the memory pillar MP in the drawing sheet constitute select transistor STa2.

Similarly, the memory pillar MP and the eight interconnect layers 44 functioning as word lines WLb0 to WLb7 provided at the right side of the memory pillar MP in the drawing sheet constitute memory cell transistors MCb0 through MCb7, respectively. The memory pillar MP and the interconnect layer 44 functioning as select gate line SGSb provided at the right side of the memory pillar MP in the drawing sheet constitute select transistor STb2. The memory pillar MP and the interconnect layer 44 functioning as select gate line SGDb provided at the right side of the memory pillar MP in the drawing sheet constitute select transistor STb1.

Accordingly, memory cell transistors MCa0 through MCa7 include the charge storage layer 32a, and memory cell transistors MCb0 through MCb7 include the charge storage layer 32b.

1.2 Method of Manufacturing Memory Cell Array

Next, a method of manufacturing the memory cell array 11 will be described with reference to FIG. 5 to FIG. 12. FIG. 5 to FIG. 12 each show a plan view of the memory cell array in the manufacturing process or a cross-sectional view taken along line A1-A2. The present embodiment will be described based on a method in which structures corresponding to the interconnect layers 44 are formed of the insulating layers 50, and then the insulating layers 50 are removed and filled with an conductive material to thereby form the interconnect layers 44 (hereinafter, "replacement"). In the following example, SiN is used for the insulating layers 50, and W and TiN are used for the conductive material of the interconnect layers 44. The insulating layers 50 are not limited to SiN. For example, the insulating layers 50 may be made of a silicon oxynitride (SiON) film, or any material, as long as the material can obtain a sufficient selection ratio in wet etching between the material and the insulating layer 43.

Figure 5:
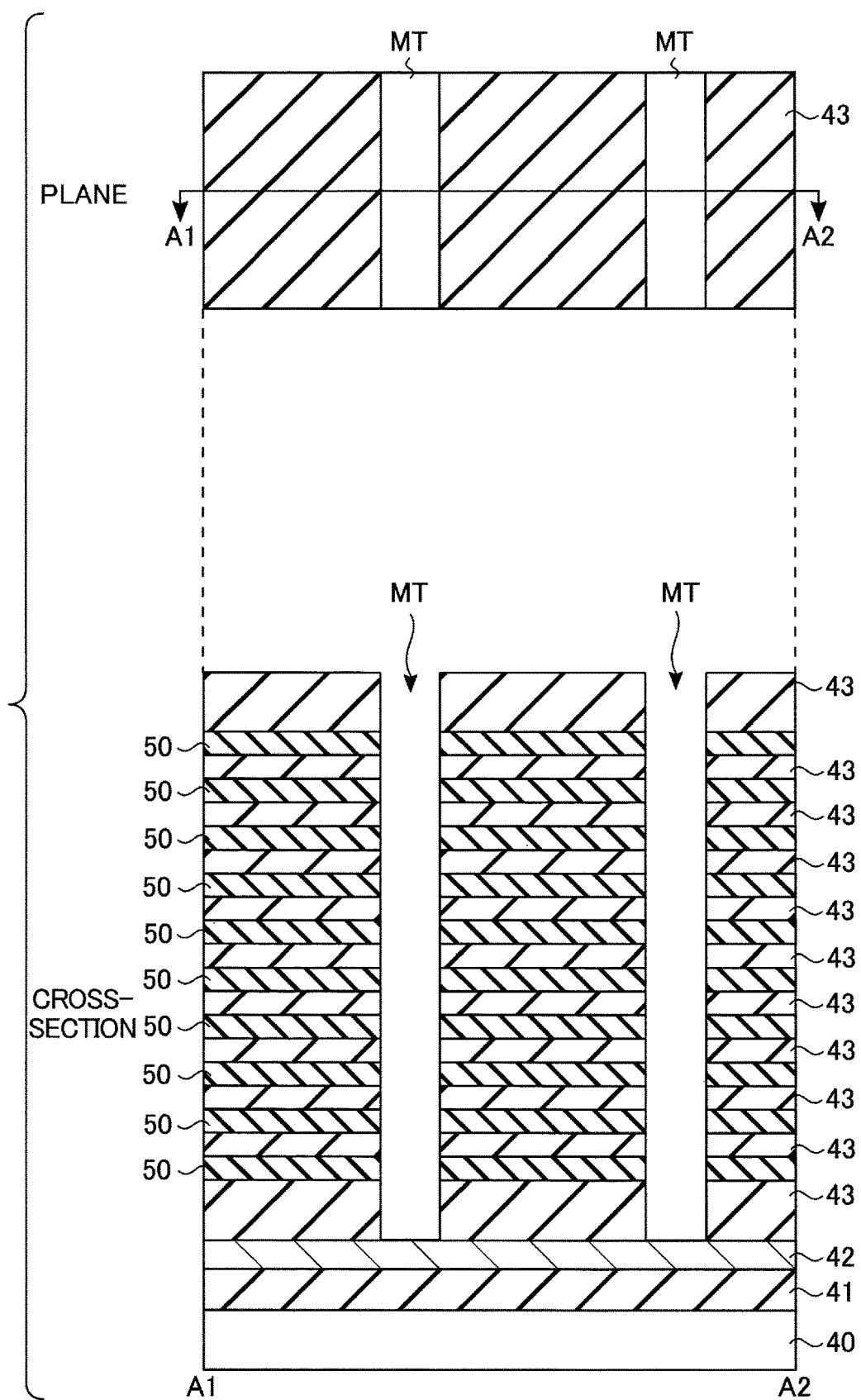
FIG. 5 is a diagram showing a process of manufacturing the memory cell array in the semiconductor memory device according to the first embodiment.

As shown in FIG. 5, the insulating layer 41 and the interconnect layer 42 are formed on the semiconductor substrate 40. On the semiconductor substrate 42, eleven insulating layers 43 and ten insulating layers 50 corresponding to the interconnect layers 44 are alternately stacked. Next, the memory trench MT that reaches the interconnect layer 42 with the bottom surface is made.

Figure 6:
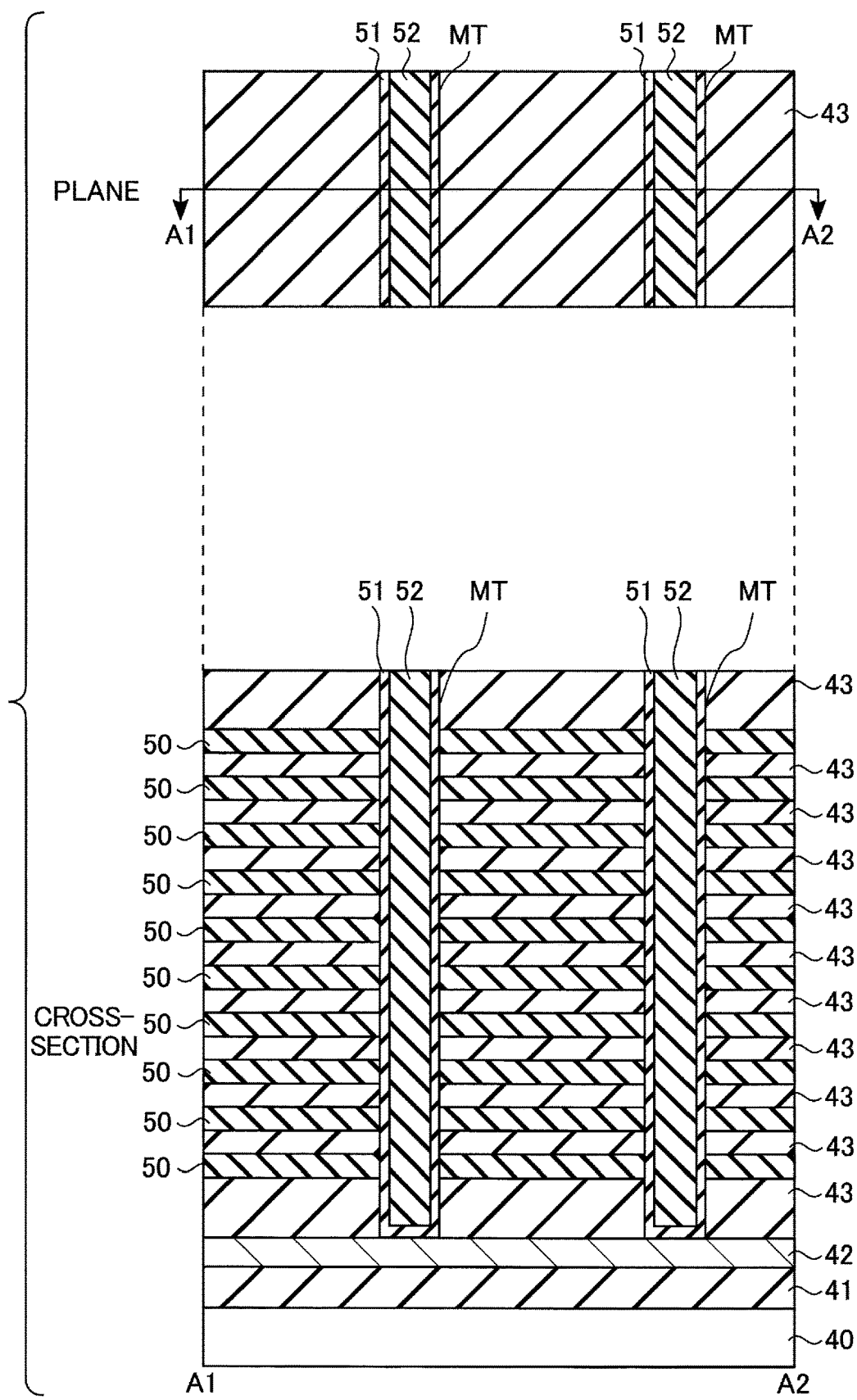
FIG. 6 is a diagram showing a process of manufacturing the memory cell array in the semiconductor memory device according to the first embodiment.

As shown in FIG. 6, after the insulating layer 51 is formed on the side surfaces and the bottom surface of the memory trench MT, the inside of the insulating layer 51 is filled with the insulating layer 52. Next, more specifically, after the inside of the memory trench MT is filled up by forming the insulating layers 51 and 52, the insulating layers 51 and 52 on the insulating layers 43 are removed by, for example, chemical mechanical polishing (CMP). The insulating layers 51 and 52 function as sacrificial layers that temporarily fill the memory trench MT in the manufacturing process of the memory cell array 11. For the insulating layers 51 and 52, for example, $SiO_2$ is used. More preferably, for the insulating layers 51 and 52, materials having a lower density than that of the insulating layer 43 and having a wet etching rate faster than that of the insulating layer 43 in wet etching using diluted hydrofluoric acid (DHF), for example, are preferable. For example, for the insulating layer 52, SOG may be used.

Figure 7:
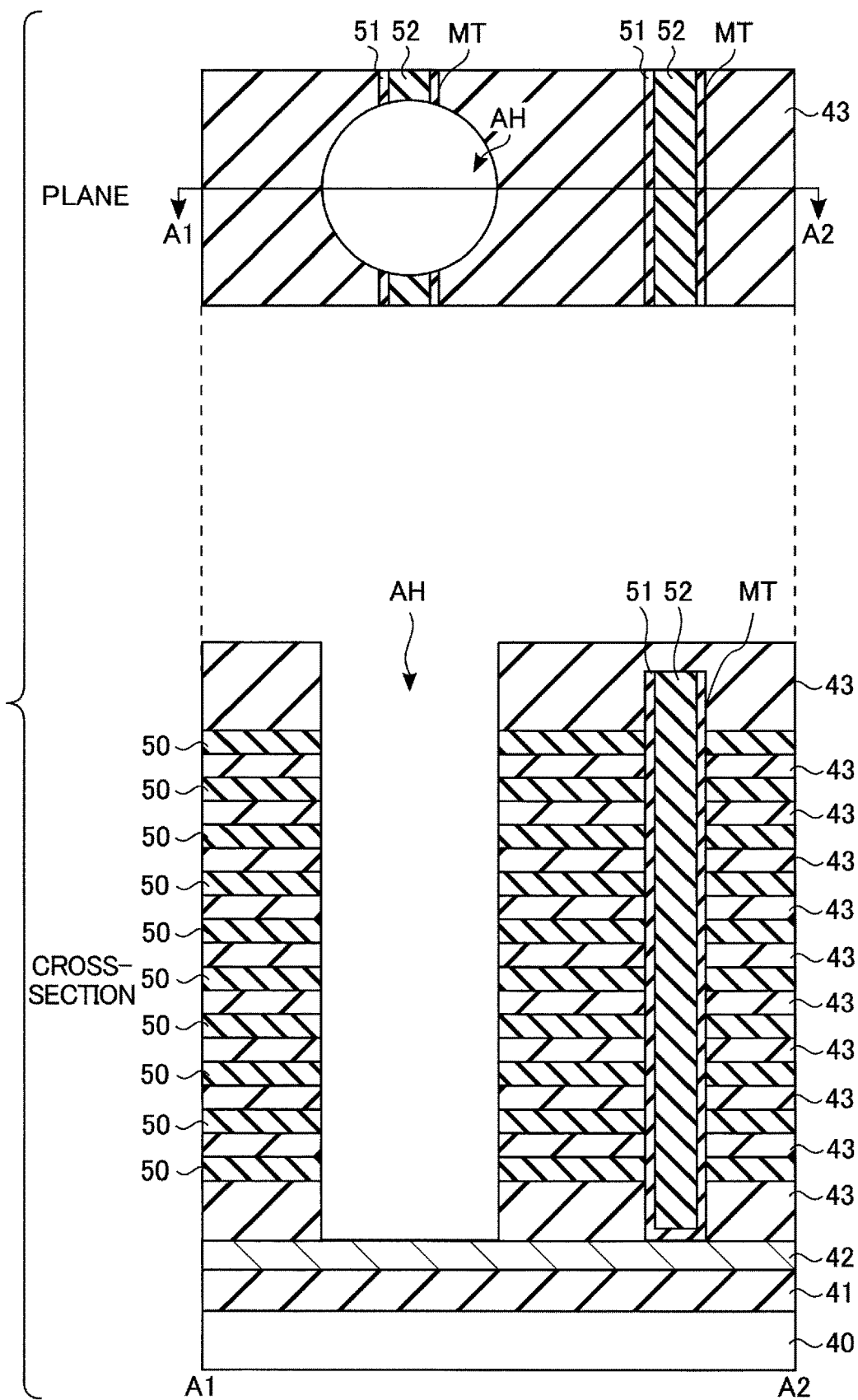
FIG. 7 is a diagram showing a process of manufacturing the memory cell array in the semiconductor memory device according to the first embodiment.

As shown in FIG. 7, after the insulating layer 43 is formed to cover the upper surface of the memory trench MT, a hole AH for forming the memory pillar MP is made to reach the interconnect layer 42 with its bottom surface.

Figure 8:
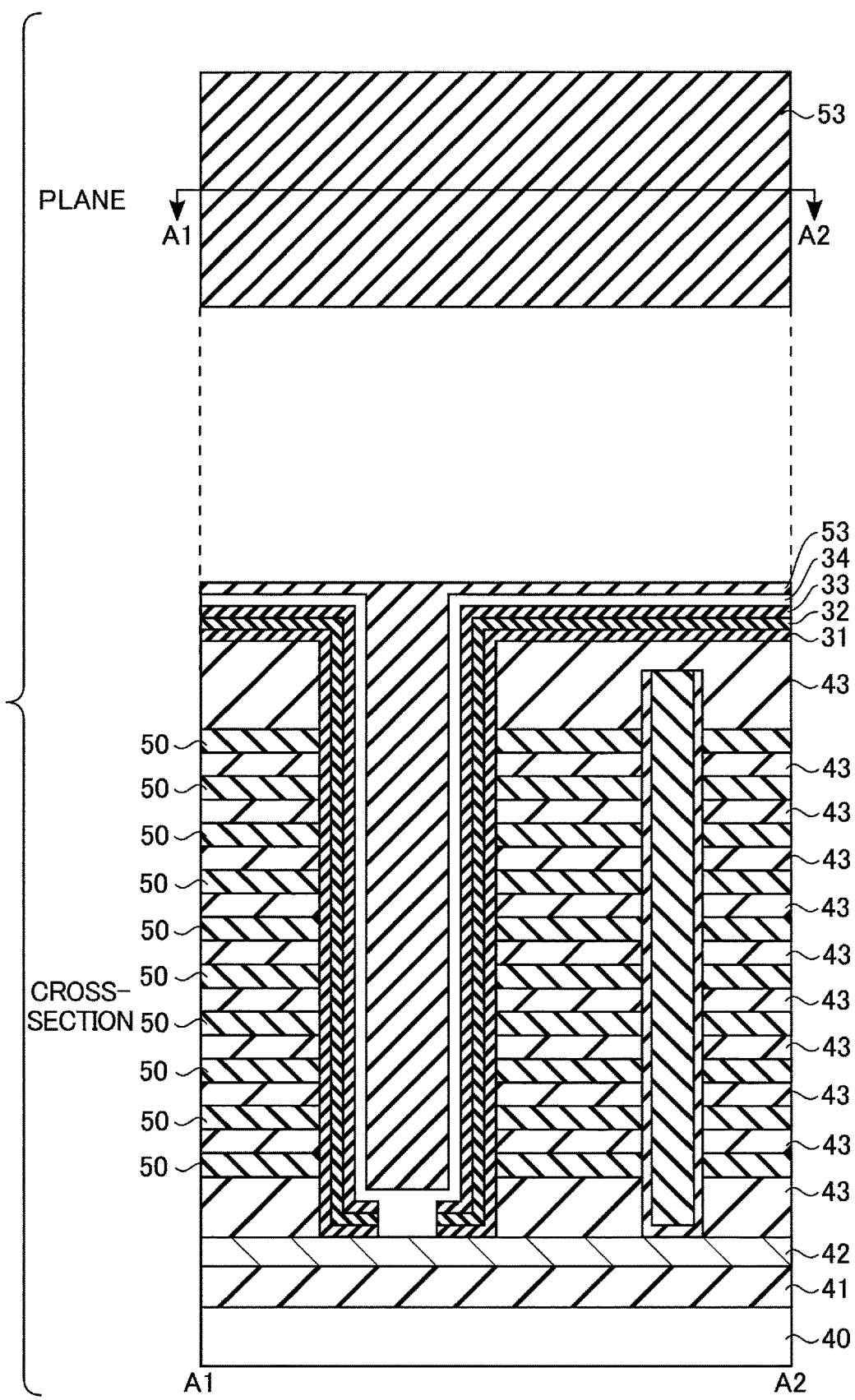
FIG. 8 is a diagram showing a process of manufacturing the memory cell array in the semiconductor memory device according to the first embodiment.

As shown in FIG. 8, a block insulating film 31, a charge storage layer 32, a tunnel insulating film 33, a semiconductor layer 34, and an insulating layer 53 are formed in order in the hole AH. More specifically, the block insulating film 31, the charge storage layer 32, the tunnel insulating film 33, the semiconductor layer 34, and the cover insulating layer (not shown), each having a film thickness not filling the hole AH, are stacked in order. For example, by using $SiO_2$ by plasma CVD for the cover insulating layer, the cover insulating layer is formed to be thicker on the insulating layer 43 than the hole AH bottom surface. Next, the cover insulating layer, the insulating layer 34, the tunnel insulating film 33, the charge storage layer 32, and the block insulating film 31 in the bottom of the hole AH are removed. At this time, the semiconductor layer 34, the tunnel insulating film 33, the charge storage layer 32, and the block insulating film 31 on the insulating layer 43 are not etched because of the cover insulating layer. Next, after the cover insulating layer is removed by wet etching, the semiconductor layer 34 and the insulating layer 53 are formed to fill in the hole AH. The insulating layer 53 functions as a sacrificial layer that temporarily fills the hole AH in the manufacturing process of the memory cell array 11. For the insulating layer 53, for example, $SiO_2$ is used. More preferably, for the insulating layer 53, a material having a lower density than that of the insulating layer 43 and having a wet etching rate faster than that of the insulating layer 43 in wet etching using DHF, for example, is preferable. For example, for the insulating layer 53, SOG may be used.

As shown in FIG. 9, an extra block insulating film 31, charge storage layer 32, tunnel insulating film 33, semiconductor layer 34, and insulating layer 53 on the insulating layer 43 are removed by dry etching, etc. At this time, etching is applied to the surface of the insulating layer 43 so that the upper surface of the memory trench MT is exposed by over-etching.

Figure 10:
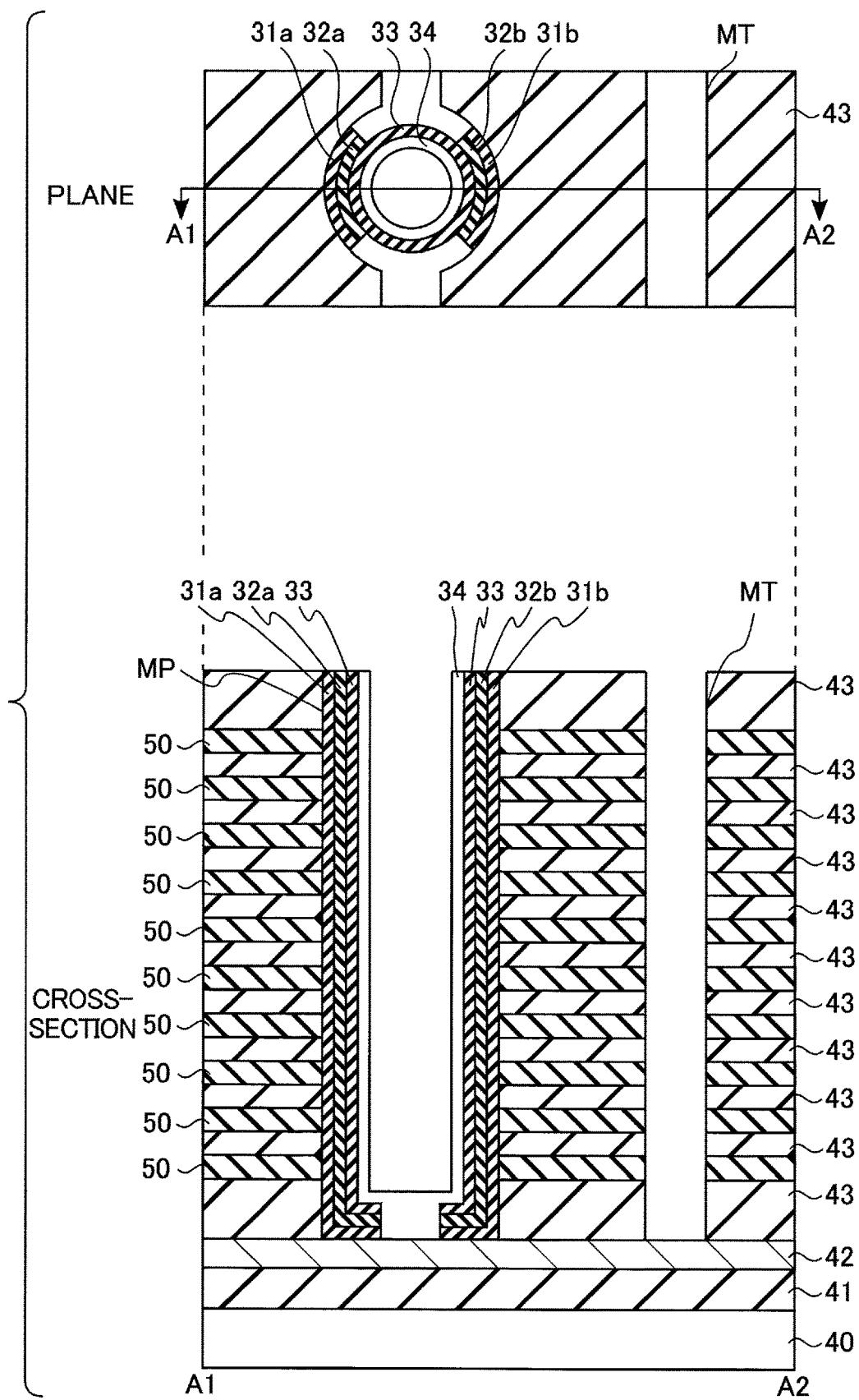
FIG. 10 is a diagram showing a process of manufacturing the memory cell array in the semiconductor memory device according to the first embodiment.

As shown in FIG. 10, at first, the insulating layers 51 and 52 of the memory trench MT, and the insulating layer 53 of the core layer are removed by wet etching using DHF, for example. Next, etching is applied to the block insulating film 31 (e.g., $Al_2O_3$) and the charge storage layer 32 (e.g., SiN) by wet etching using phosphoric acid ($H_3PO_4$), for example. At this time, the block insulating film 31 and the charge storage layer 32 are etched in an arc direction of the memory pillar MP from the side surface exposed in the memory trench MT. Thus, for example, wet etching time is controlled to adjust the etching amount in the arc direction. Thereby, the block insulating film 31 and the charge storage layer 32 are each separated into two, forming block insulating films 31a and 31b, as well as charge storage layers 32a and 32b.

Figure 11:
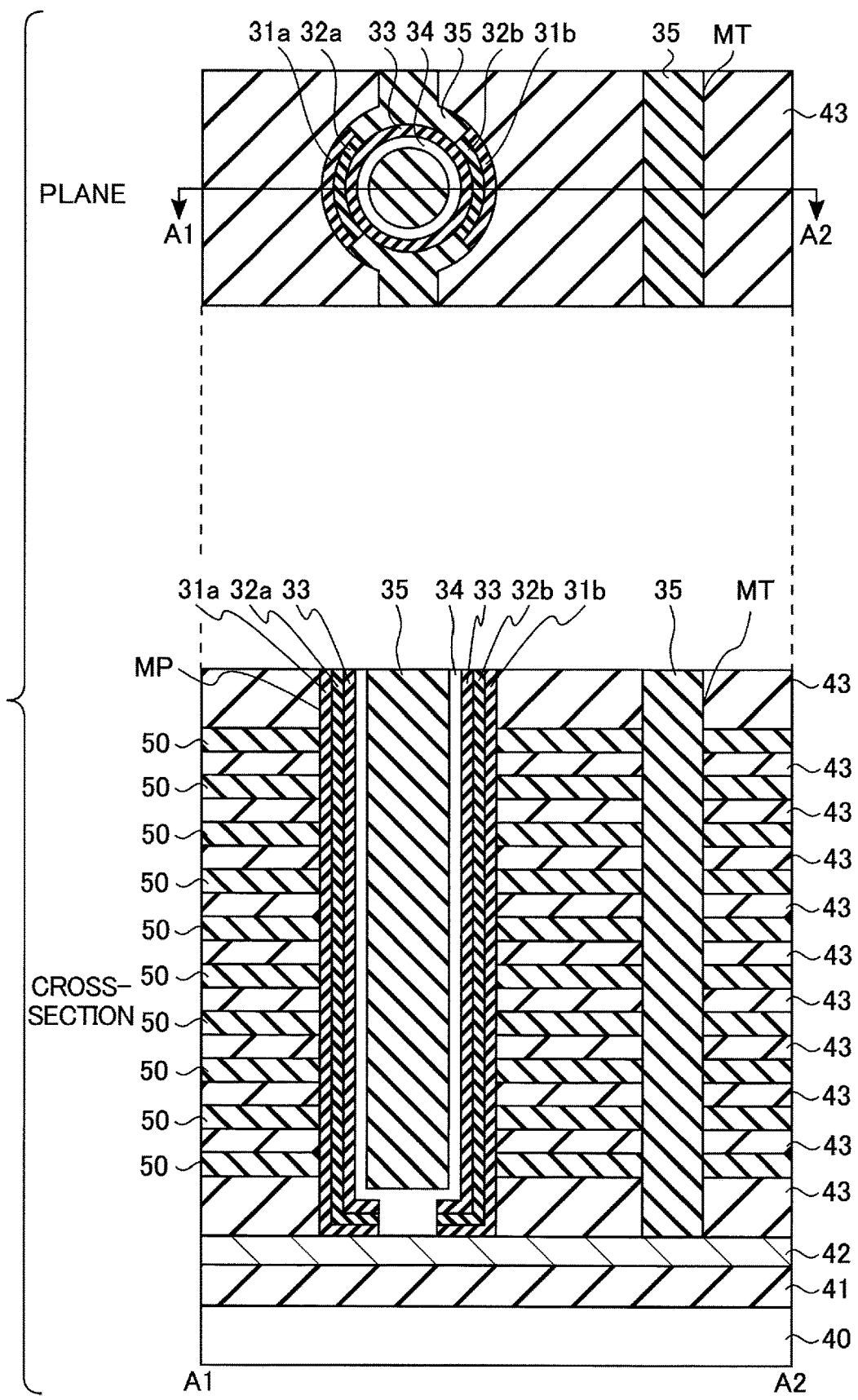
FIG. 11 is a diagram showing a process of manufacturing the memory cell array in the semiconductor memory device according to the first embodiment.

As shown in FIG. 11, the memory trench MT and the core area (core layer) are filled with the insulating layers 35.

Figure 12:
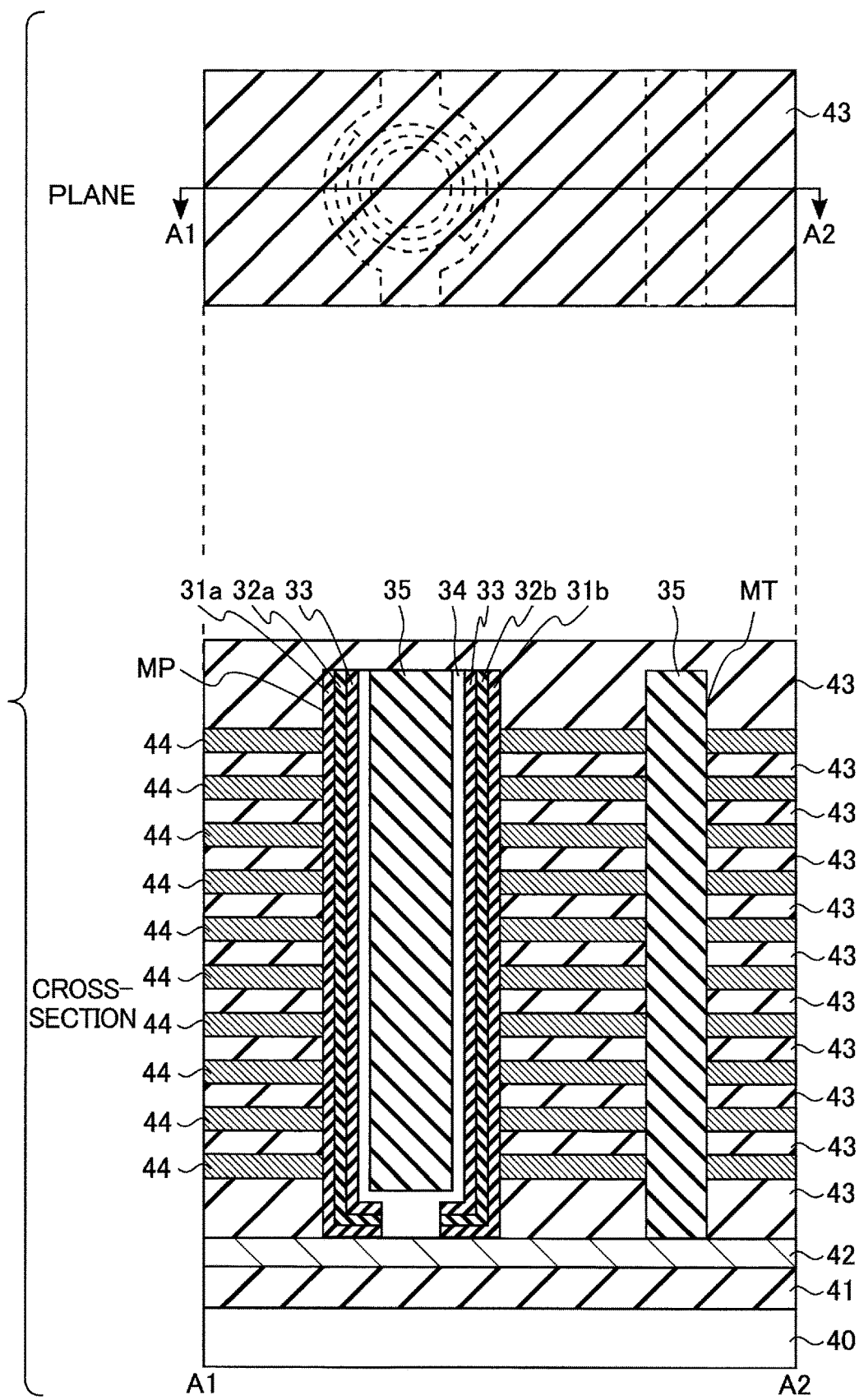
FIG. 12 is a diagram showing a process of manufacturing the memory cell array in the semiconductor memory device according to the first embodiment.

As shown in FIG. 12, the insulating layer 43 is formed to cover the upper surfaces of the memory pillar MP and the memory trench MT. Next, the insulating layers 50 are replaced to form the interconnect layers 44. More specifically, a slit (not shown) passing through ten insulating layers 50 is formed. Next, the insulating layers 50 are removed from the slit side by wet etching. Then, gaps formed by removing the insulating layers 50 are filled with TiN and W. Extra TiN and W in the slit and on the insulating layer 43 are removed, and then the slit is filled with the insulating layer 43, and the replacement process is completed.

1.3 Etching Amounts of Block Insulating Film and Charge Storage Layer

Figure 13:
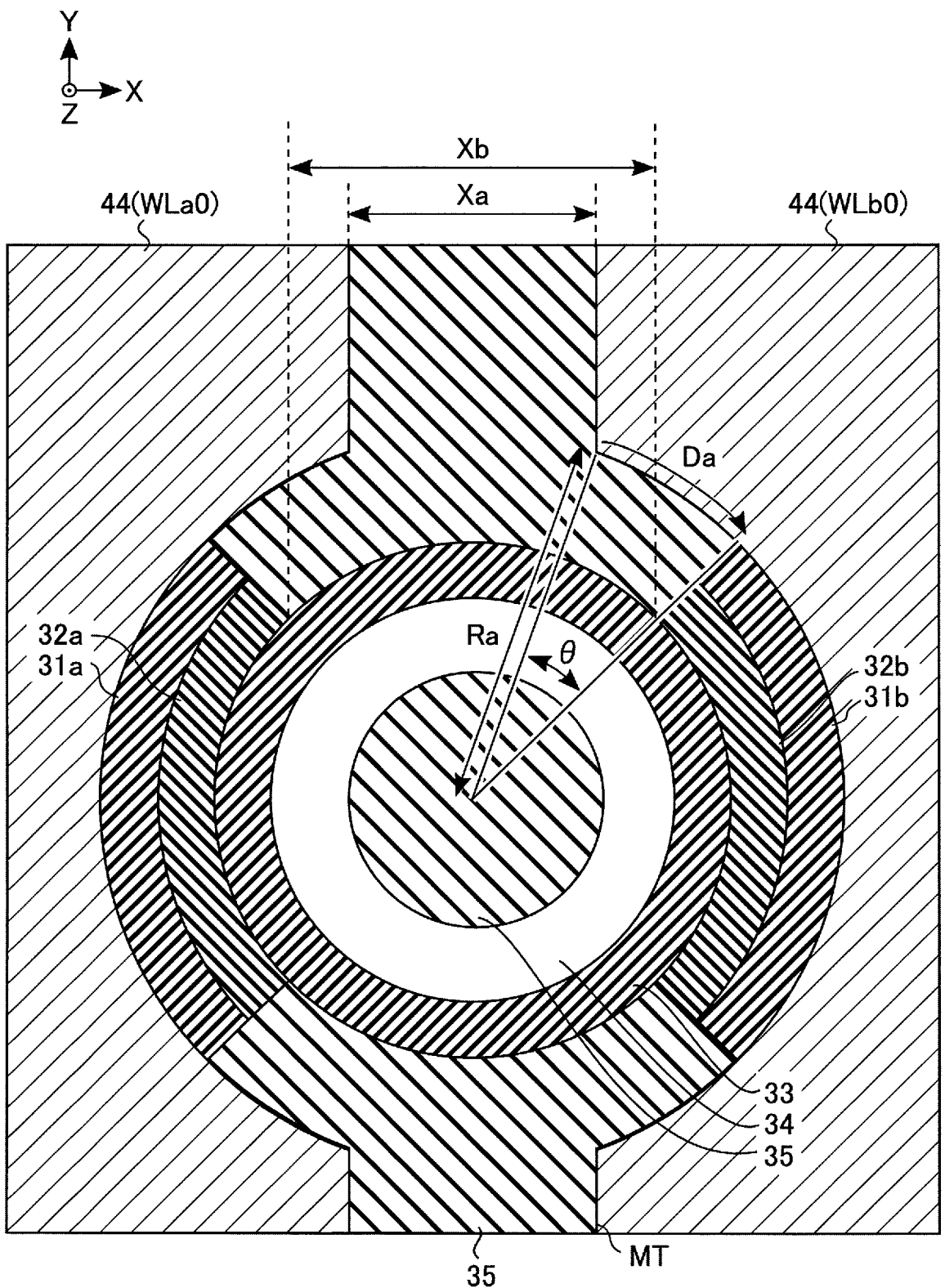
FIG. 13 is a cross-sectional view of the memory pillar in the XY plane in the semiconductor memory device according to the first embodiment.

Next, etching amounts of the block insulating film 31 and the charge storage layer 32 will be described with reference to FIG. 13. FIG. 13 is a cross-sectional view of the memory pillar MP in the XY plane along the upper surfaces of word lines WLa0 and WLb0.

As shown in FIG. 13, when etching is applied to the block insulating film 31 and the charge storage layer 32 in an arc direction of the memory pillar MP, the etching width in the X direction is set to be wider than the width of the memory trench MT. That is, if the shortest distance (width) of the memory trench MT in the area not including the memory pillar MP in the X direction is defined as Xa, and the shortest distance between the charge storage layers 32a and 32b in the X direction in one memory pillar MP is defined as Xb, the relationship is Xa≤Xb. For this reason, in the ends of the memory cell transistors MCa and MCb, the block insulating films 31a and 31b and the charge storage layers 32a and 32b are replaced with the insulating layers 35. Thus, the effective full size of memory cell transistors MCa and MCb differs in accordance with distance Xb.

For example, the radius of the memory pillar MP is defined as Ra, and the distance (length of the arc) in which the charge storage layer 32 is etched from the contact position of the side surface of the memory pillar MP and the end of the memory trench MT in the arc direction of the memory pillar MP is defined as Da. An angle when etching is applied for the distance Da to the charge storage layer 32 in the memory pillar MP is defined as θ. If maximum value θmax of the angle θ is obtained from the width Xa of the memory trench MT and the radius Ra of the memory pillar MP, θmax is as follows:

$$\theta max = \cos^{-1}(Xa/(2Ra))$$

The minimum value of the angle θ is when the etching amount of the charge storage layer 32 corresponds to the width Xa of the memory trench MT, i.e., when the angle θ is 0. Thus, the angle θ is within the range of $0 \leq \theta < \cos^{-1}(Xa/(2Ra))$.

As the angle θ increases, the area of the charge storage layers 32 (32a and 32b) decreases, and the chargeable charge amount decreases. For this reason, if the memory cell transistors MC hold 8-valued (3-bit) data, for example, the voltage difference in the respective threshold levels becomes small, and reading of the data becomes difficult. For example, assuming that the memory cell transistors MC can hold 8-valued data and data determination is impossible if the margin of the threshold distribution decreases by 50%, a malfunction of the memory cell transistors MC occurs when the width of the charge storage layer 32 becomes 4/7 (area of 57% from θ=0). Thus, the maximum value of distance Da is 21.4% of the effective width of the charge storage layer 32 (32a or 32b). Thus, the angle θ may be within the range of $0 \leq \theta < 0.214 \cdot \cos^{-1}(Xa/(2Ra))$.

1.4 Effects According to Present Embodiment

With the configuration of the present embodiment, reliability can be improved. Details of the effects will be described.

For example, there is a case where in one memory pillar MP, the block insulating film 31 and the charge storage layer 32 of two memory cell transistors MC formed on the same plane are not separated by the memory trench MT. That is, there is a case where two memory cell transistors MC share the charge storage layer 32. In such a case, there is a possibility that during the read operation, for example, even if the selected memory cell transistor MC is in an off state, if the parasitic transistor is turned on in the end of the selected memory cell transistor MC, a current flows into the channel, which results in an error read.

In contrast, according to the configuration of the present embodiment, in one memory pillar MP, the block insulating film 31 and the charge storage layer 32 can be separated. That is, the charge storage layer 32 of two memory cell transistors MC formed on the same plane can be separated. Thereby, it is possible to reduce the possibility that the parasitic transistor is turned on in the end of the selected memory cell transistor MC and an error read is caused. Moreover, according to the configuration of the present embodiment, materials having a relative dielectric constant lower than that of the charge storage layer 32 can be formed inside the memory trench MT and in the end of the memory cell transistor MC. Thus, it is possible to prevent two memory cell transistors MC from interfering with each other, and to prevent an error read. Therefore, reliability of the semiconductor memory device can be improved.

In addition, according to the configuration of the present embodiment, since the semiconductor layer 34 is not separated by the memory trench MT, it is possible to suppress the reduction in the ON current (cell current) in the memory pillar MP.

2. Second Embodiment

Next, the second embodiment will be described. In the second embodiment, a description will be given of two examples regarding configurations of the memory pillar MP and the memory trench MT different from those in the first embodiment. The following description will be given focusing on the matters different from the first embodiment.

2.1 First Example

Figure 14:
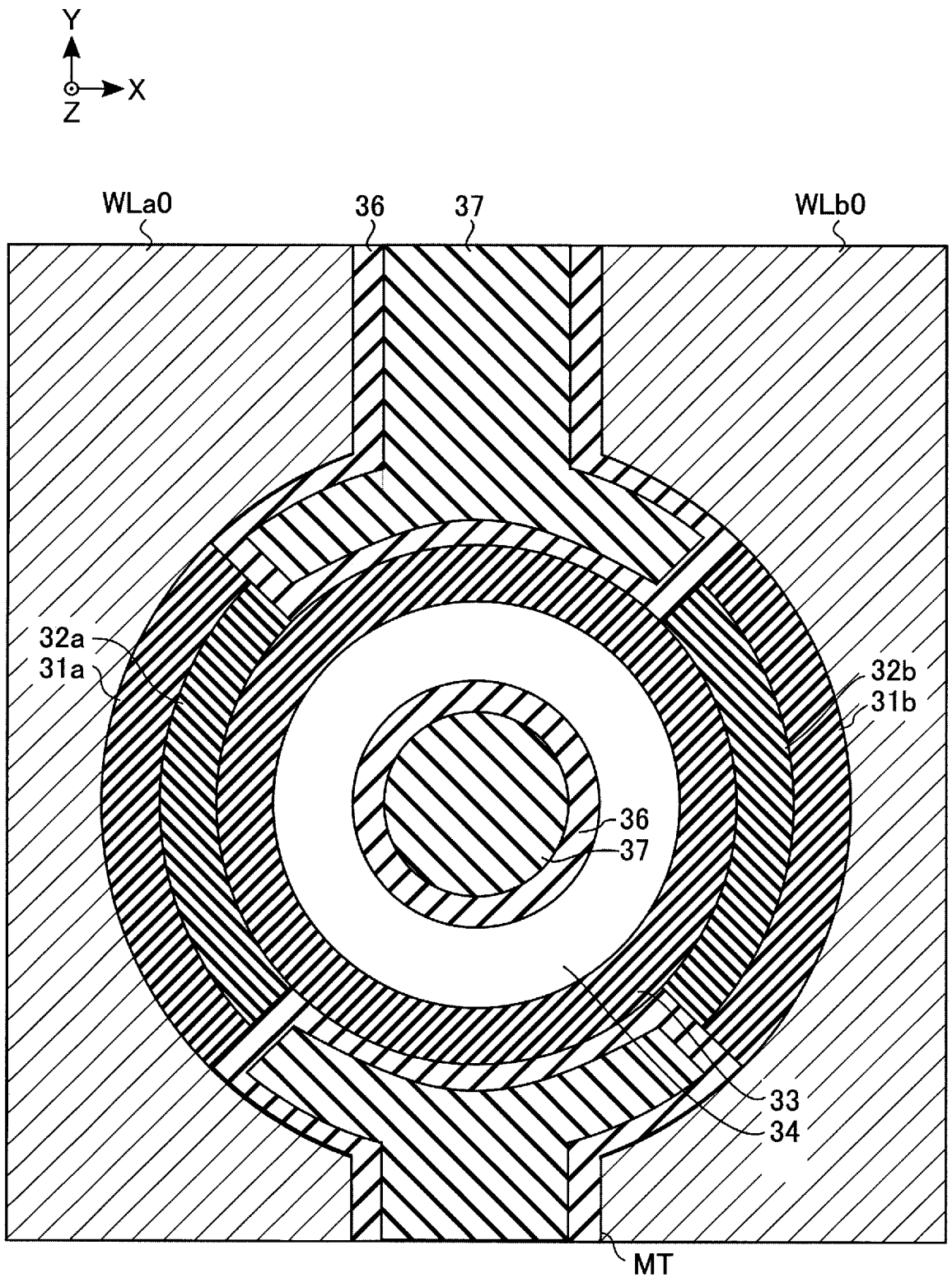
FIG. 14 is a cross-sectional view of the memory pillar in the XY plane in the semiconductor memory device according to the first example of the second embodiment.

First, the first example will be described with reference to FIG. 14 and FIG. 15. FIG. 14 is a cross-sectional view of the memory pillar MP in the XY plane, and FIG. 15 is a cross-sectional view of the memory pillar MP and the memory trench MT in the Z direction.

As shown in FIG. 14, the insulating layers 36 and 37 are used for the memory trench MT and the core layer. In the memory pillar MP, the area where the block insulating film 31 and the charge storage layer 32 are etched may be filled with a stacked structure of the insulating layers 36 and 37, or may be filled with the insulating layer 36.

Figure 15:
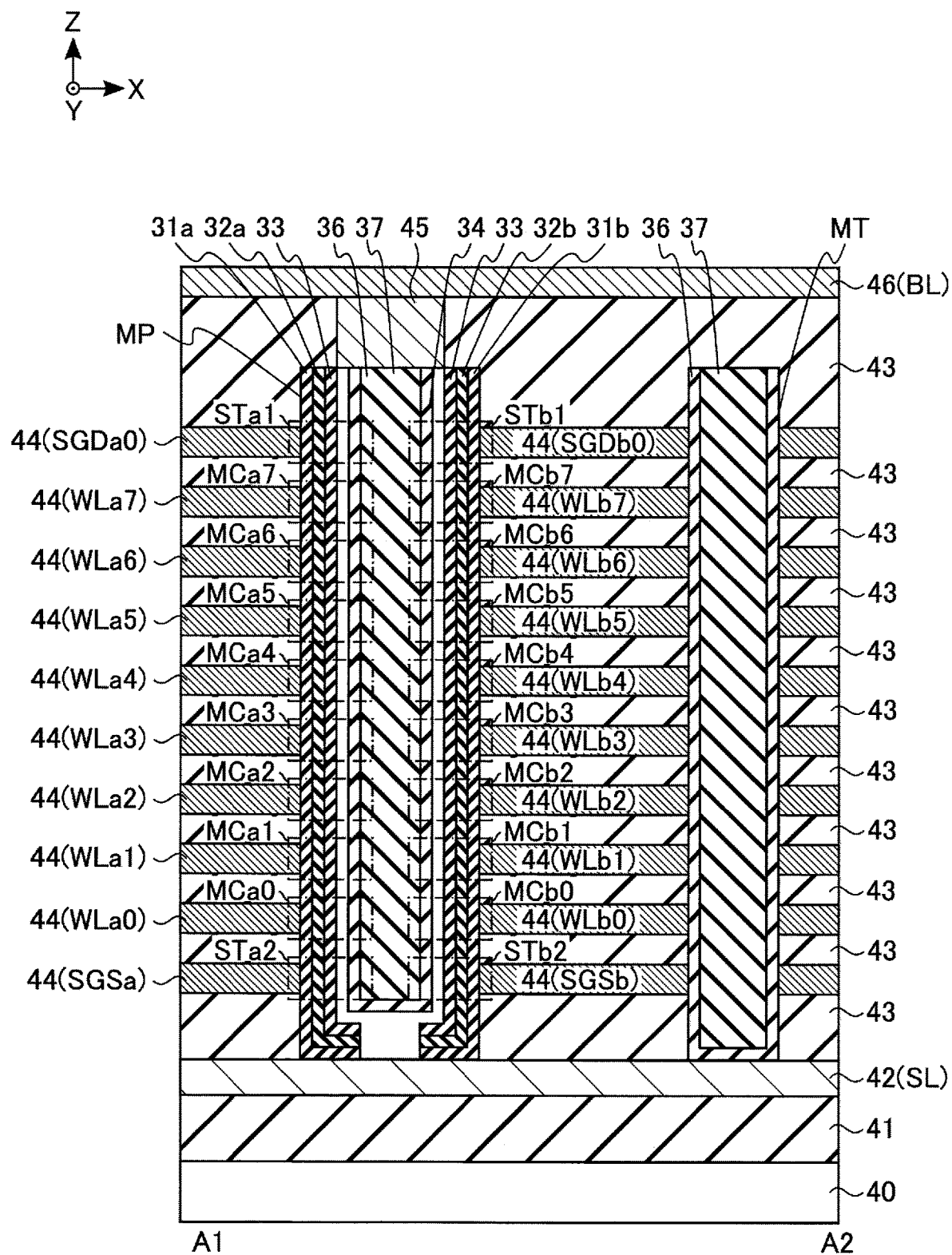
FIG. 15 is a cross-sectional view of the memory cell array along the Z direction in the semiconductor memory device according to the first example of the second embodiment.

As shown in FIG. 15, the insulating layer 36 that is in contact with the side surfaces and the bottom surface of the memory trench MT and the insulating layer 36 that is in contact with the side surfaces and the bottom surface of the semiconductor layer 34 are formed, and the insulating layer 37 is formed to fill the inside of the insulating layer 36.

For the insulating layer 36 and 37, an insulating material having a relative dielectric constant lower than that of the charge storage layers 32 is used. For example, for the insulating layer 36, SiOC or SiOF, etc. may be used as a low-dielectric constant insulating film having a relative dielectric constant lower than that of $SiO_2$, and for the insulating layer 37, $SiO_2$ (SOG) may be used.

The memory trench MT and the core layer may be filled with three or more insulating materials.

2.2 Second Example

Figure 16:
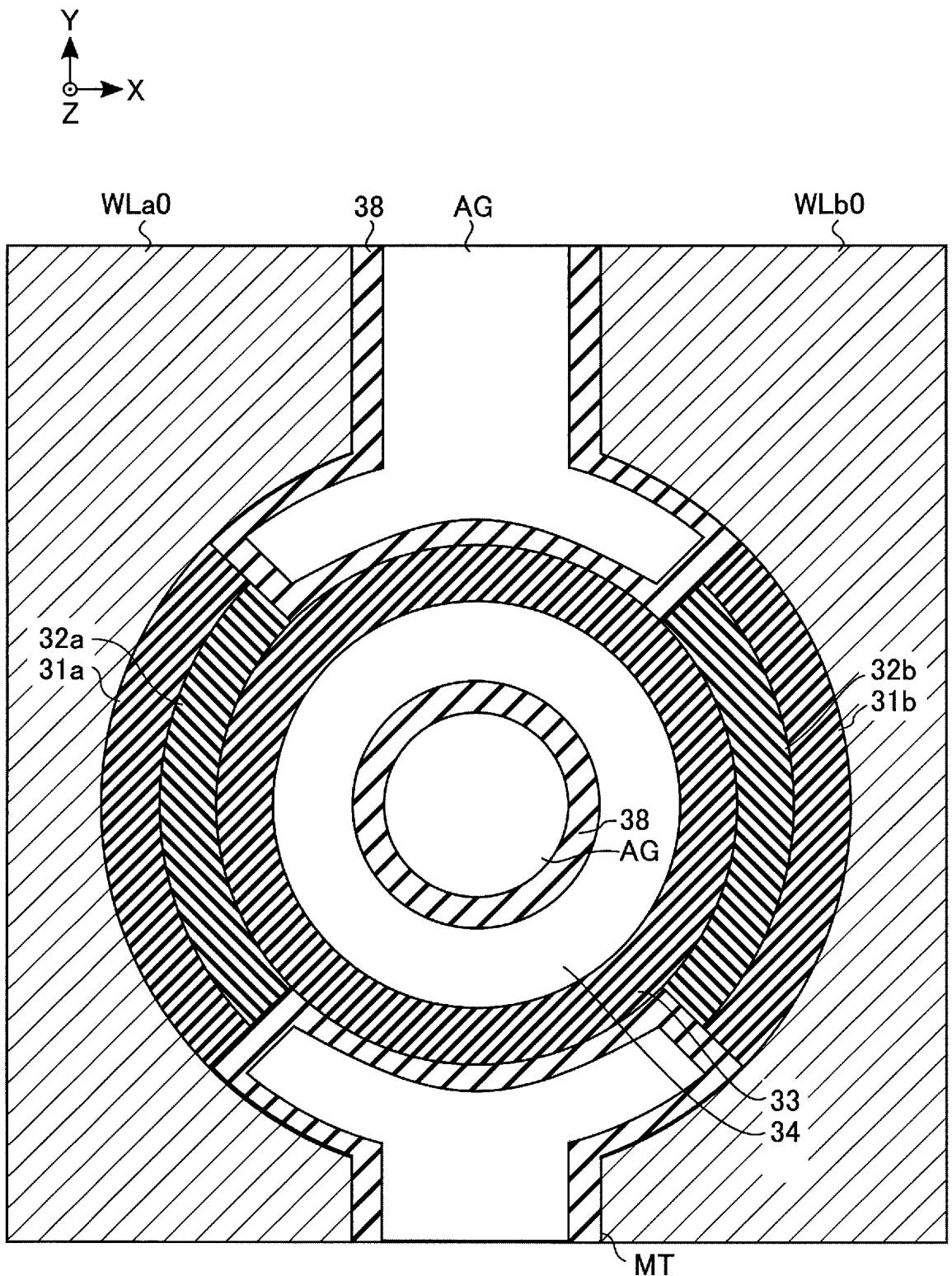
FIG. 16 is a cross-sectional view of the memory pillar in the XY plane in the semiconductor memory device according to the second example of the second embodiment.

Next, the second example will be described with reference to FIG. 16 and FIG. 17. FIG. 16 is a cross-sectional view of the memory pillar MP in the XY plane, and FIG. 17 is a cross-sectional view of the memory pillar MP and the memory trench MT in the Z direction.

As shown in FIG. 16, the insulating layer 38 is used for the memory trench MT and the core layer, and air gap AG is formed inside the insulating layer 38. In the memory pillar MP, air gap AG may be formed in the area where the block insulating film 31 and the charge storage layer 32 are etched, and it may be filled with the insulating layer 38.

Figure 17:
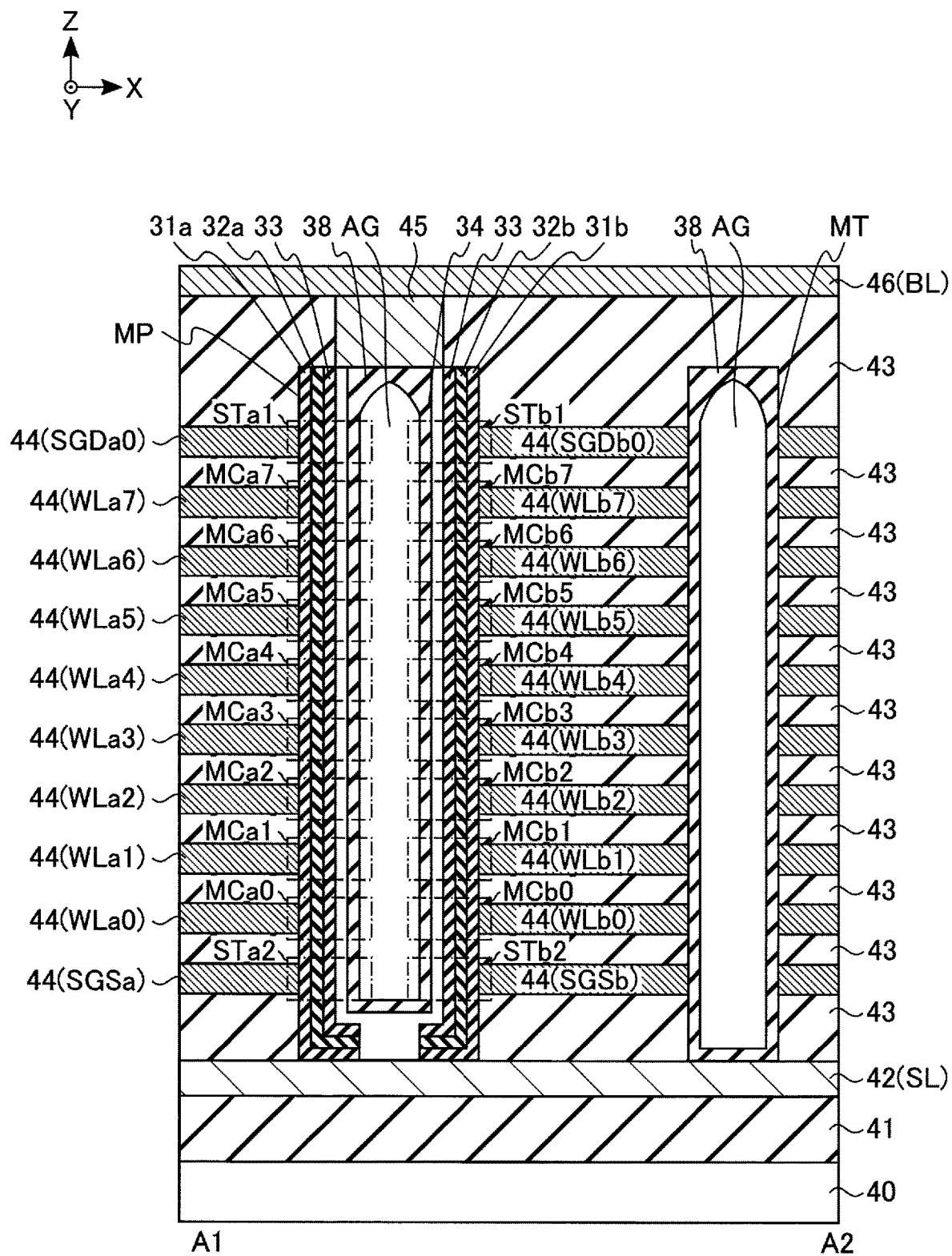
FIG. 17 is a cross-sectional view of the memory cell array along the Z direction in the semiconductor memory device according to the second example of the second embodiment.

As shown in FIG. 17, the insulating layer 38 that is in contact with the side surfaces and the bottom surface of the memory trench MT and the insulating layer 38 that is in contact with the side surfaces and the bottom surface of the semiconductor layer 34 are formed, and air gap AG is formed inside the insulating layer 38.

For the insulating layer 38, an insulating material having a relative dielectric constant lower than that of the charge storage layers 32 is used. For example, for the insulating layer 38, $SiO_2$, which have poor step coverages by plasma CVD, is used. Thus, when $SiO_2$ is formed, the upper portions of the memory trench MT and the memory pillar MP are closed, and the air gaps AG are formed.

2.3 Effects According to Present Embodiment

The configuration of the present embodiment can be applied to the first embodiment. Thus, the second embodiment achieves the advantageous effects similar to those in the first embodiment.

3. Third Embodiment

Next, the third embodiment will be described. In the third embodiment, a description will be given based on the case where different insulating materials are used for the core layer and the memory trench MT. In the following, mainly the parts different from those of the first embodiment will be described.

3.1 Configuration of Memory Pillar

First, the configuration of the memory pillar MP will be described. FIG. 18 is a cross-sectional view of the memory pillar MP in the XY plane, and FIG. 19 is a cross-sectional view of the memory pillar MP and the memory trench MT in the Z direction.

As shown in FIG. 18 and FIG. 19, the insulating layer 35 is used for the memory trench MT, and the insulating layer 39 is used for the core layer. For the insulating layer 35 and the insulating layer 39, different insulating materials each having a relative dielectric constant lower than that of the charge storage layers 32 are used. For example, for the insulating layer 39, $SiO_2$ (SOG) is used, and for the insulating layer 35, SiOC or SiOF, etc. may be used as a low-dielectric constant insulating film having a relative dielectric constant lower than that of $SiO_2$.

3.2 Method of Manufacturing Memory Cell Array

Next, a method of manufacturing the memory cell array 11 will be described with reference to FIG. 20 to FIG. 25.

Figure 20:
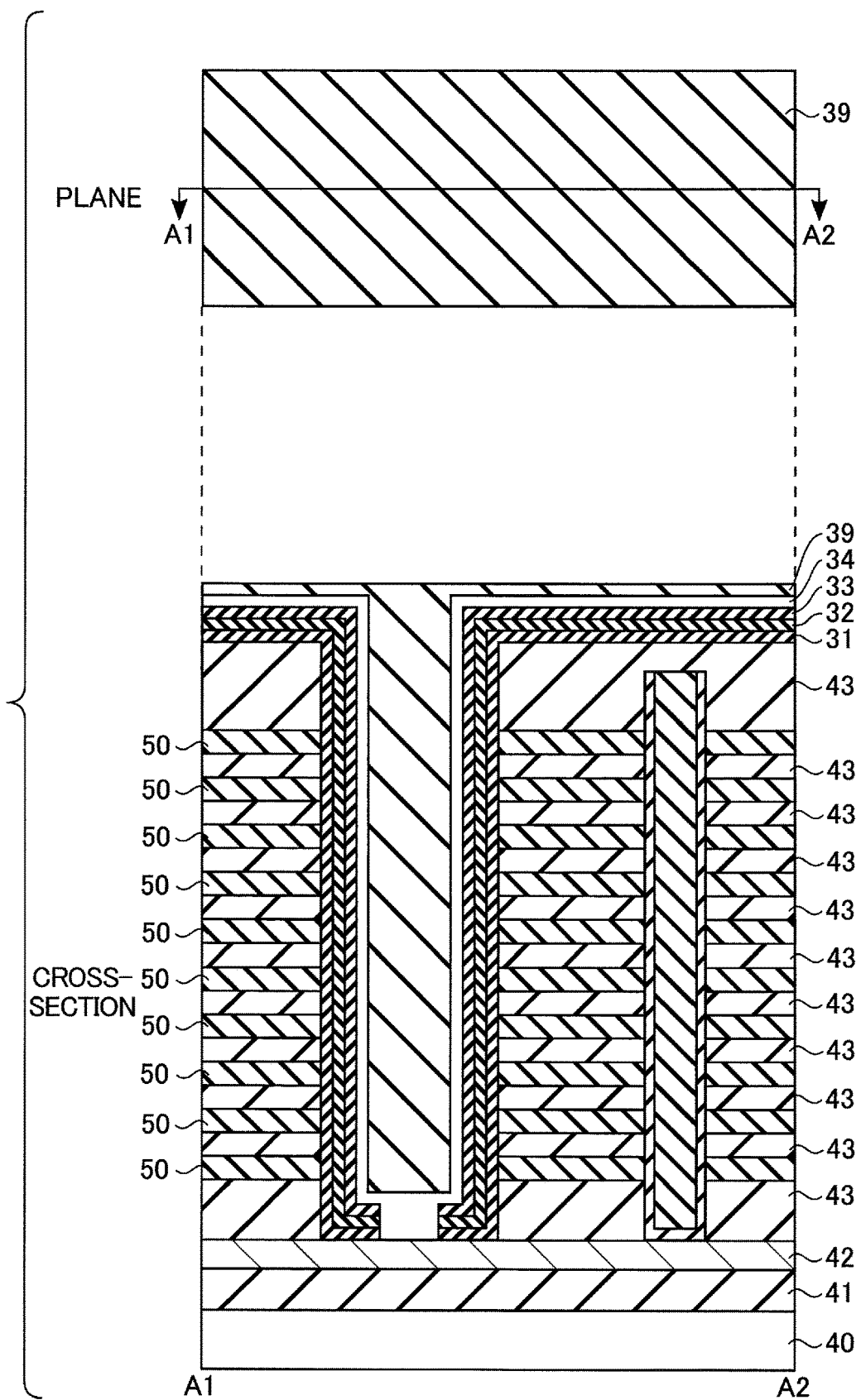
FIG. 20 is a diagram showing a process of manufacturing the memory cell array in the semiconductor memory device according to the third embodiment.

As shown in FIG. 20, like FIG. 5 to FIG. 8 of the first embodiment, after the semiconductor layer 34 is formed in the hole AH, the insulating layer 39 is formed to fill in the hole AH.

Figure 21:
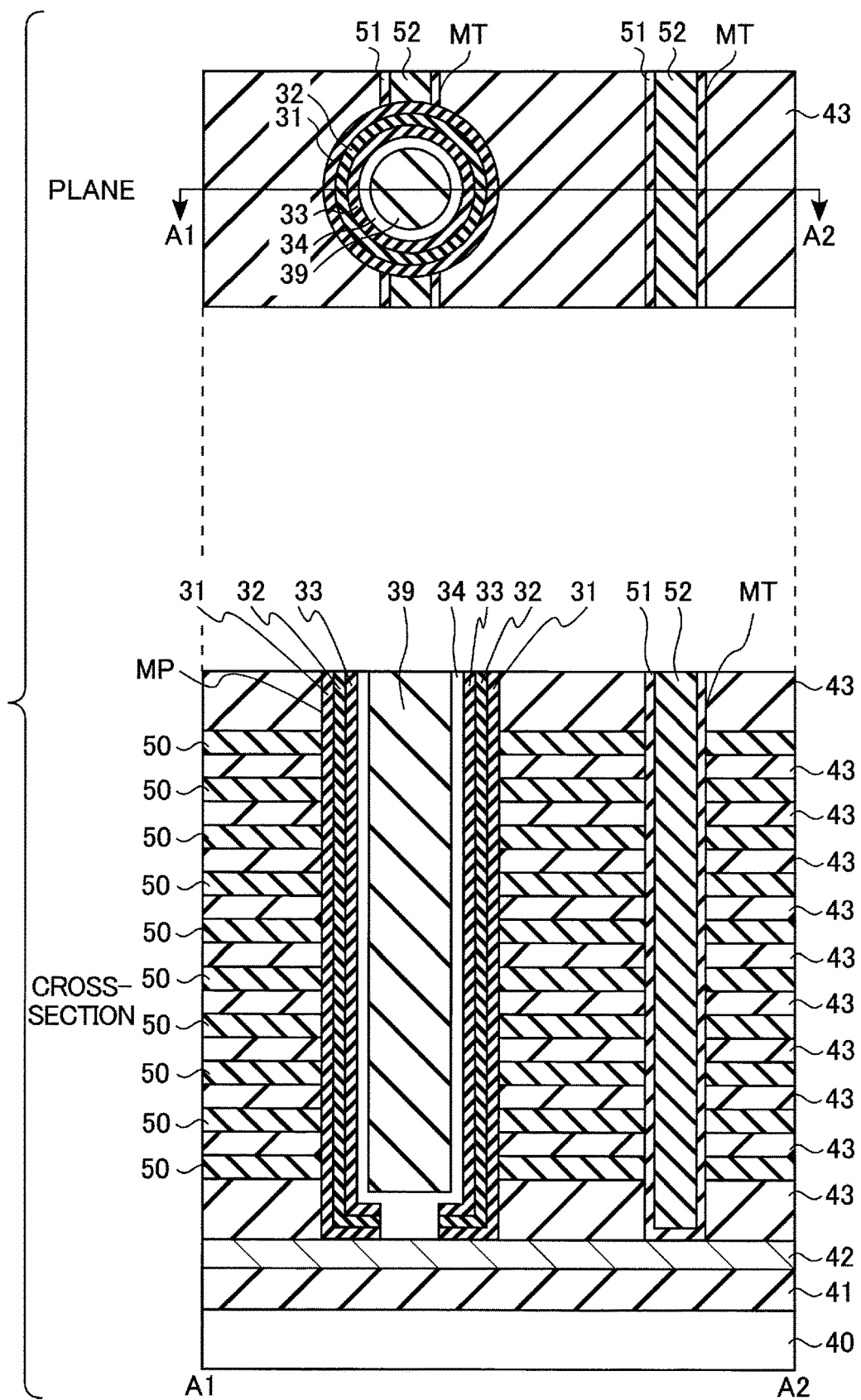
FIG. 21 is a diagram showing a process of manufacturing the memory cell array in the semiconductor memory device according to the third embodiment.

As shown in FIG. 21, an extra block insulating film 31, charge storage layer 32, tunnel insulating film 33, semiconductor layer 34, and insulating layer 39 on the insulating layer 43 are removed by dry etching, etc. At this time, etching is applied to the surface of the insulating layer 43 to expose the upper surface of the memory trench MT by over-etching.

Figure 22:
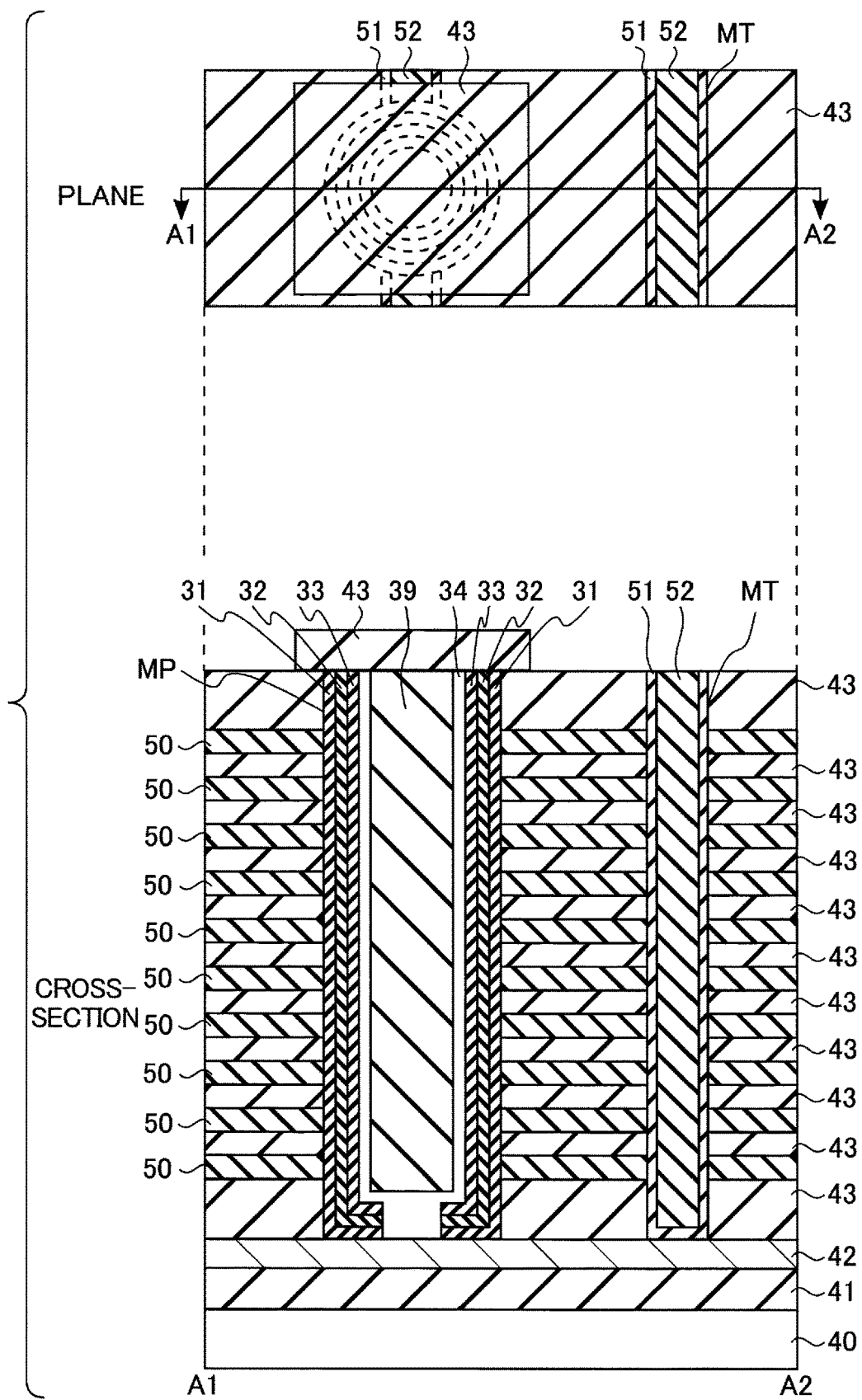
FIG. 22 is a diagram showing a process of manufacturing the memory cell array in the semiconductor memory device according to the third embodiment.

As shown in FIG. 22, an insulating layer 43, for example, is formed as a cover layer on the memory pillar MP. The cover layer is not limited to the insulating layer 43. Any insulating material may be used as long as the insulating material can obtain a sufficient selection ratio in etching when the insulating layers 51 and 52 in the memory trench MT are removed.

As shown in FIG. 23, at first, the insulating layers 51 and 52 of the memory trench MT are removed by wet etching using DHF, for example. Next, etching is applied to the block insulating film 31 (e.g., $Al_2O_3$) and the charge storage layer 32 (e.g., SiN) by wet etching using phosphoric acid ($H_3PO_4$), for example. At this time, the block insulating film 31 and the charge storage layer 32 are etched in an arc direction of the memory pillar MP from the side surface exposed in the memory trench MT. Thereby, the block insulating film 31 and the charge storage layer 32 are each separated into two, forming block insulating films 31a and 31b, as well as charge storage layers 32a and 32b.

Figure 24:
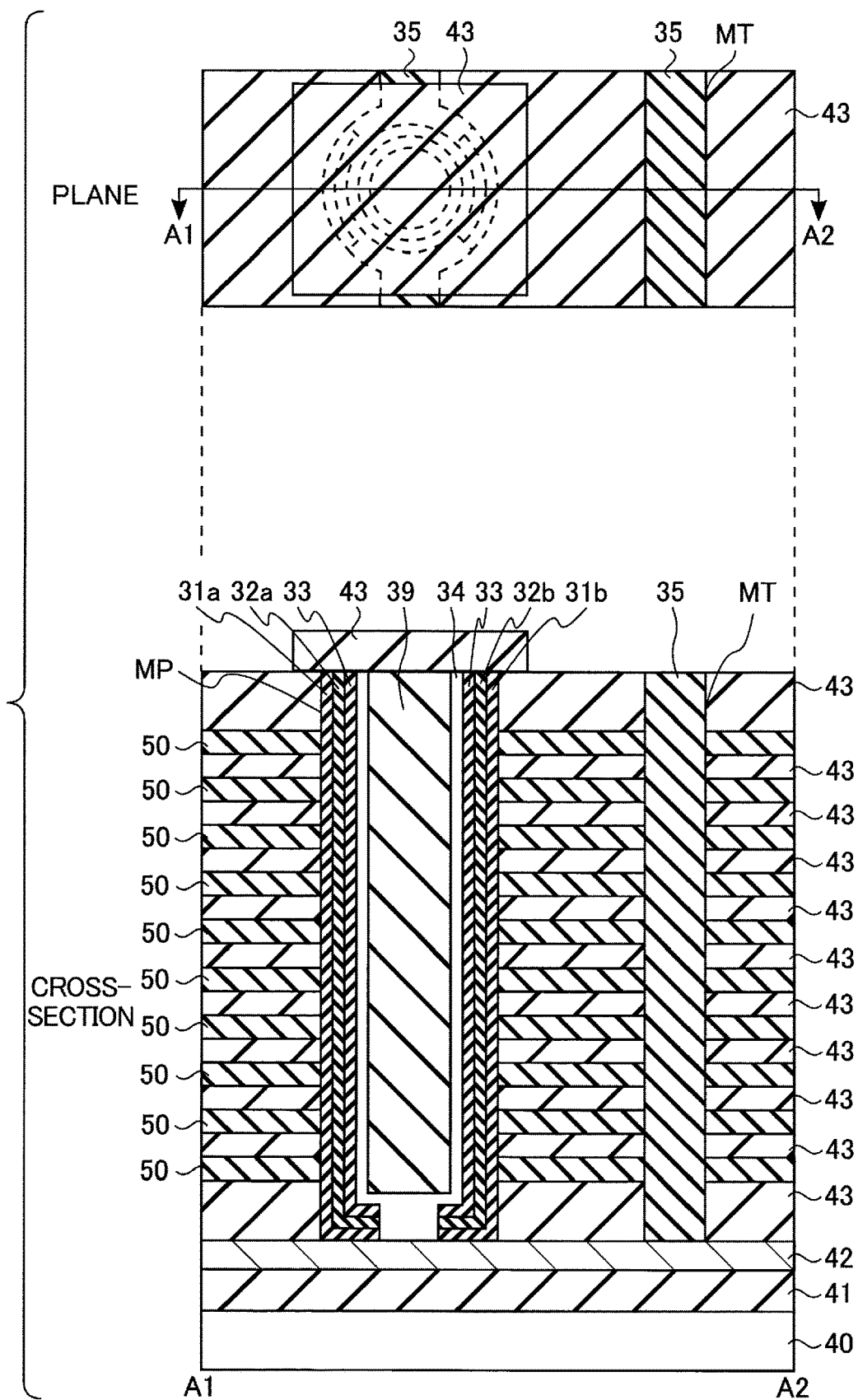
FIG. 24 is a diagram showing a process of manufacturing the memory cell array in the semiconductor memory device according to the third embodiment.

As shown in FIG. 24, the etched area of the memory trench MT and the memory pillar MP are filled with the insulating layer 35.

As shown in FIG. 25, the insulating layer 43 is formed to cover the upper surfaces of the memory pillar MP and the memory trench MT. Next, the insulating layers 50 are replaced to form the interconnect layers 44.

3.3 Effects According to Present Embodiment

According to the configuration of the present embodiment, the effects similar to those of the first embodiment can be obtained.

4. Fourth Embodiment

Next, the fourth embodiment will be described. In the fourth embodiment, a description will be given of two examples for the configuration of the memory trench MT different from that in the third embodiment. The following description will be given focusing on the matters different from the third embodiment.

4.1 First Example

Figure 26:
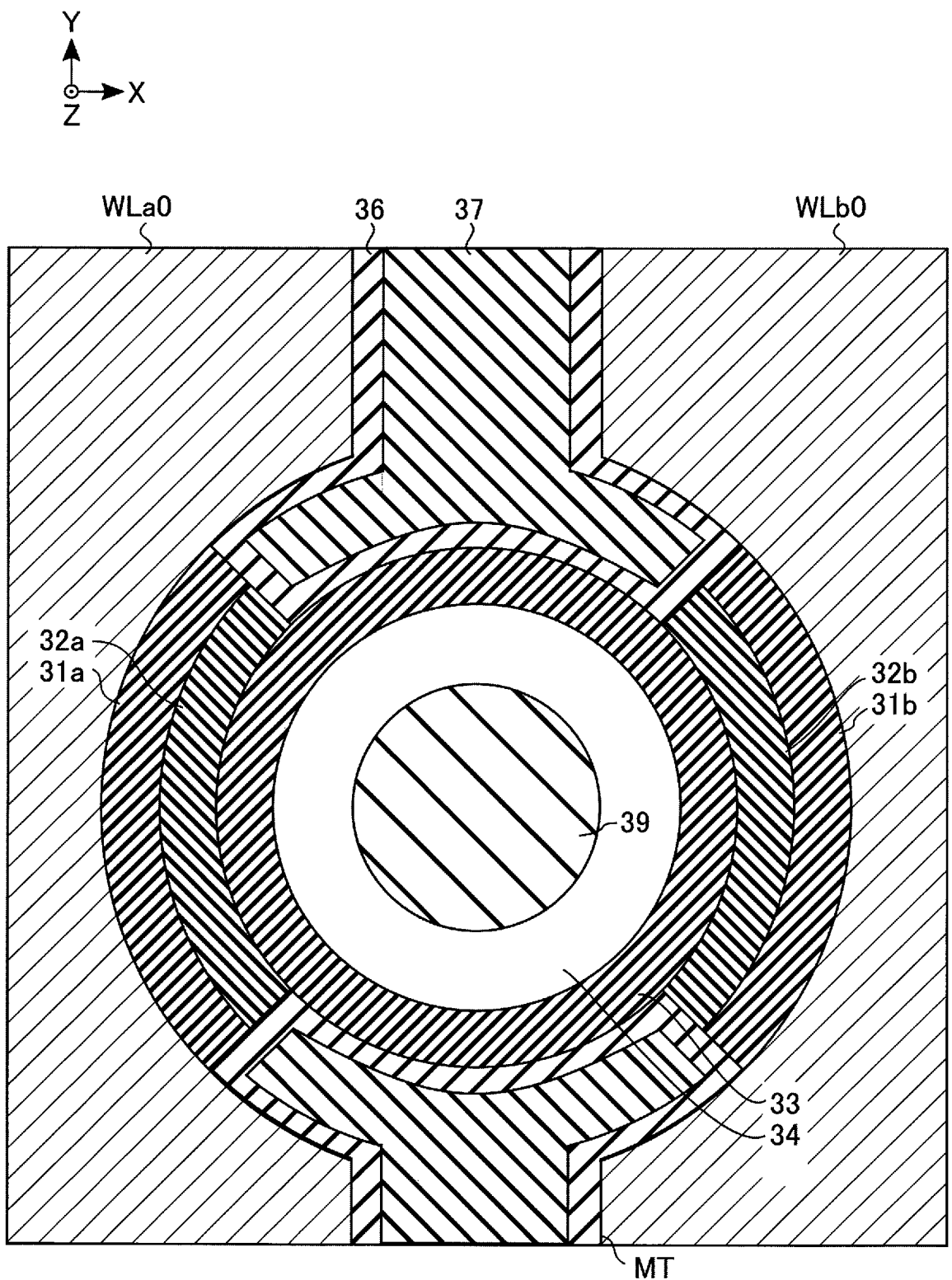
FIG. 26 is a cross-sectional view of the memory pillar in the XY plane in the semiconductor memory device according to the first example of the fourth embodiment.

First, the first example will be described with reference to FIG. 26 and FIG. 27. FIG. 26 is a cross-sectional view of the memory pillar MP in the XY plane, and FIG. 27 is a cross-sectional view of the memory pillar MP and the memory trench MT in the Z direction.

As shown in FIG. 26, the insulating layers 36 and 37 are used for the memory trench MT. In the memory pillar MP, the area where the block insulating film 31 and the charge storage layer 32 are etched may be filled with a stacked structure of the insulating layers 36 and 37, or may be filled with the insulating layer 36.

As shown in FIG. 27, the insulating layer 36 that is in contact with the side surfaces and the bottom surface of the memory trench MT is formed, and the insulating layer 37 is formed to fill the inside of the insulating layer 36.

4.2 Second Example

Figure 28:
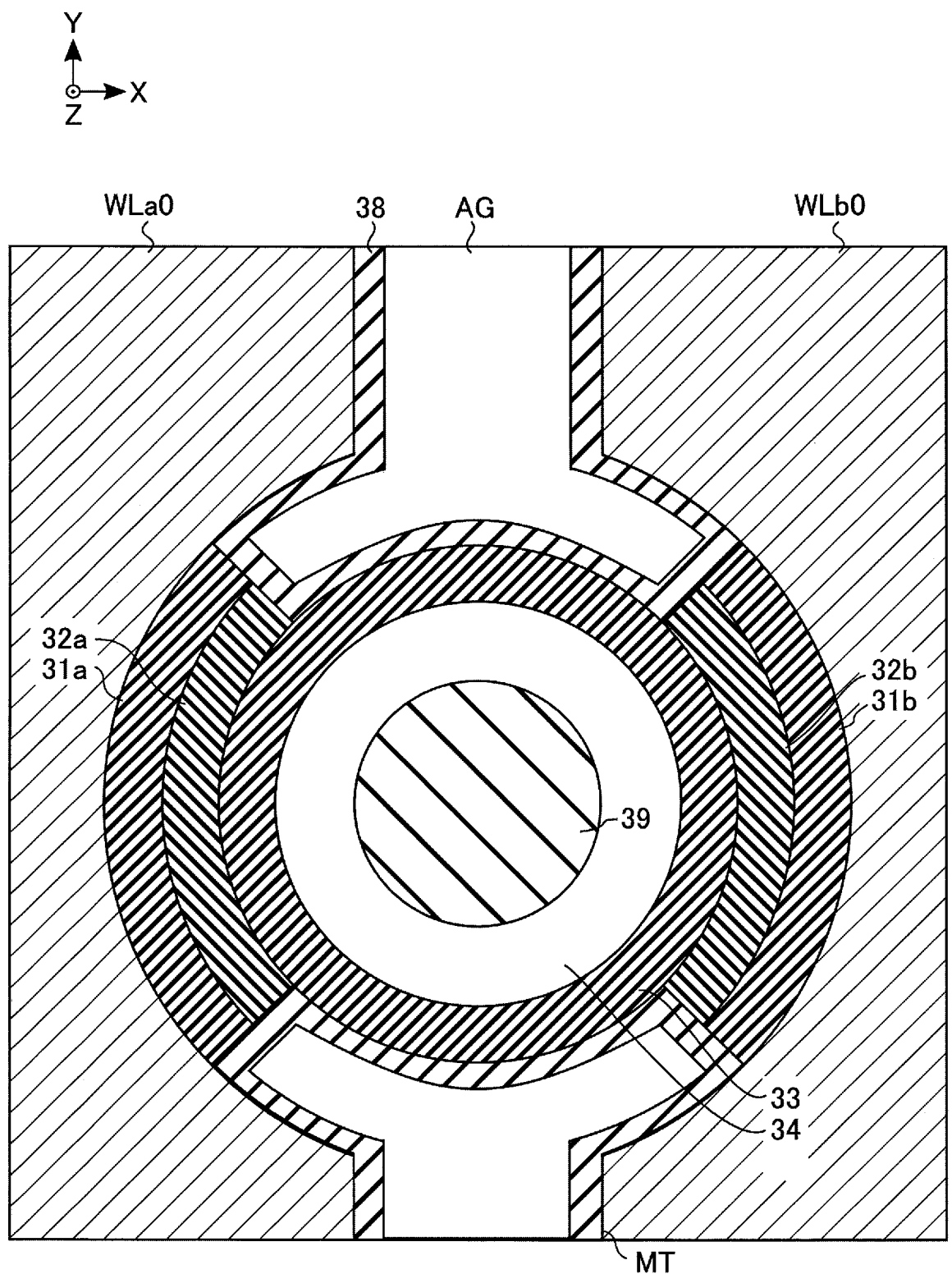
FIG. 28 is a cross-sectional view of the memory pillar in the XY plane in the semiconductor memory device according to the second example of the fourth embodiment.

Next, the second example will be described with reference to FIG. 28 and FIG. 29. FIG. 28 is a cross-sectional view of the memory pillar MP in the XY plane, and FIG. 29 is a cross-sectional view of the memory pillar MP and the memory trench MT in the Z direction.

As shown in FIG. 28, the insulating layer 38 is used for the memory trench MT, and air gap AG is formed inside the insulating layer 38. In the memory pillar MP, air gap AG may be formed in the area where the block insulating film 31 and the charge storage layer 32 are etched, or it may be filled with the insulating layer 38.

Figure 29:
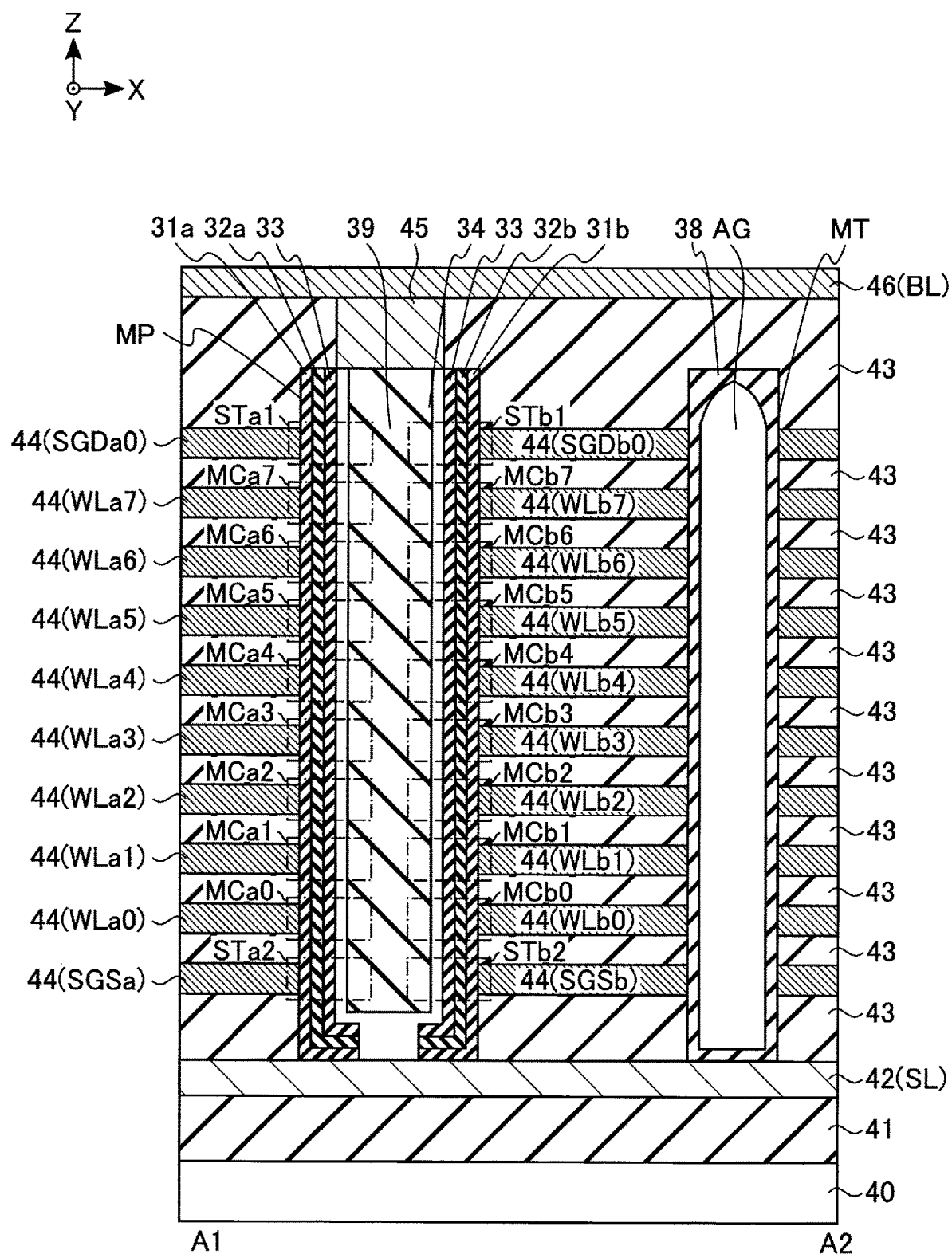
FIG. 29 is a cross-sectional view of the memory cell array along the Z direction in the semiconductor memory device according to the second example of the fourth embodiment.

As shown in FIG. 29, the insulating layer 38 that is in contact with the side surfaces and the bottom surface of the memory trench MT is formed, and the air gap AG is formed inside the insulating layer 38.

4.3 Effects According to Present Embodiment

The configuration of the present embodiment can be applied to the third embodiment. Thus, the fourth embodiment achieves the advantageous effects similar to those in the first embodiment.

5. Modifications, Etc.

A semiconductor memory device according to the first embodiment includes: a first interconnect layer (44; WLa0) extending in a first direction (Y direction); a second interconnect layer (44; WLb0) provided to be adjacent to the first interconnect layer in a second direction (X direction) intersecting with the first direction, and extending in the first direction; a semiconductor layer (34) provided between the first interconnect layer and the second interconnect layer, and extending in a third direction (Z direction) intersecting with the first direction and the second direction; a first charge storage layer (32a) provided between the first interconnect layer and the semiconductor layer in the second direction; and a second charge storage layer (32b) provided between the second interconnect layer and the semiconductor layer in the second direction. A first distance (Xa) between the first interconnect layer and the second interconnect layer in the second direction is shorter than a second distance (Xb) between the first charge storage layer and the second charge storage layer in the second direction.

The application of the above-described embodiments allows for the provision of a semiconductor memory device that can be made more reliable.

The present invention is not limited to the above-described embodiments, and various modifications are possible.

For example, the second example of the second embodiment may have the configuration illustrated in FIG. 30 and FIG. 31. FIG. 30 is a cross-sectional view of the memory pillar MP in the XY plane, and FIG. 31 is a cross-sectional view of the memory cell array taken along B1-B2 of FIG. 30. Specifically, in the area where the block insulating film 31 and the charge storage layer 32 are etched in the arc direction of the memory pillar MP, air gap AG may be formed while the insulating layer 38 is not formed. If the distance between the interconnect layer 44 and the tunnel insulating film 33 is relatively short, there may be a case where the insulating layer 38 is not formed in the area where the block insulating film 31 and the charge storage layer 32 are etched in the arc direction of the memory pillar MP. Moreover, as indicated in the first example of the second embodiment, the inside of the memory trench MT and the portion of the core layer may be filled with the insulating layers 37. In this case, air gap AG is formed in the area where the block insulating film 31 and the charge storage layer 32 are etched in the arc direction of the memory pillar MP, and air gap AG is not formed in the memory trench MT. Still further, instead of forming a plurality of layers like the insulating films 37 and 38, a single layer of the insulating layer 35 may be formed as in the first embodiment.

For example, in the memory pillar MP, a semiconductor layer may be formed as a cap layer on the upper surfaces of the semiconductor layer 34 and the core layer.

In the above-described embodiments, like the block insulating films 31a and 31b and the charge storage layers 32a and 32b, the tunnel insulating film 33 may be separated into two.

Furthermore, the phrase "coupling" in the above-described embodiments includes a state in which components are indirectly connected with another components such as a transistor or a resistor interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first interconnect layer extending in a first direction;
   a second interconnect layer provided to be adjacent to the first interconnect layer in a second direction intersecting with the first direction, and extending in the first direction;
   a first semiconductor layer provided between the first interconnect layer and the second interconnect layer, and extending in a third direction intersecting with the first direction and the second direction;
   a first charge storage layer provided between the first interconnect layer and the first semiconductor layer in the second direction; and
   a second charge storage layer provided between the second interconnect layer and the first semiconductor layer in the second direction,
   wherein a first distance between the first interconnect layer and the second interconnect layer in the second direction is shorter than a second distance between the first charge storage layer and the second charge storage layer in the second direction.

2. The device according to claim 1, further comprising:
   a third interconnect layer extending in the first direction, and provided above the first interconnect layer; and
   a fourth interconnect layer extending in the first direction, provided to be adjacent to the third interconnect layer, and provided above the second interconnect layer,
   wherein the first charge storage layer is provided between the third interconnect layer and the first semiconductor layer, and
   the second charge storage layer is provided between the fourth interconnect layer and the first semiconductor layer.

3. The device according to claim 1, further comprising:
   a first insulating layer provided between the first interconnect layer and the second interconnect layer, and in contact with the first and second interconnect layers.

4. The device according to claim 3, wherein
   a part of the first insulating layer is provided between the first interconnect layer and the first semiconductor layer, and between the second interconnect layer and the first semiconductor layer.

5. The device according to claim 3, wherein
   the first insulating layer is in contact with the first and second charge storage layers.

6. The device according to claim 1, further comprising:
   a second insulating layer in contact with the first semiconductor layer and the first and second charge storage layers;
   a third insulating layer provided between the first interconnect layer and the first charge storage layer; and
   a fourth insulating layer provided between the second interconnect layer and the second charge storage layer.

7. The device according to claim 3, wherein
   the first insulating layer has a relative dielectric constant lower than those of the first and second charge storage layers.

8. The device according to claim 3, wherein
   the first insulating layer includes at least one of $SiO_2$, SiOC, and SiOF.

9. The device according to claim 1, wherein
   one end of the first semiconductor layer is coupled to a fifth interconnect layer; and
   the other end of the first semiconductor layer is coupled to a sixth interconnect layer.

10. The device according to claim 1, further comprising:
    a second semiconductor layer provided between the first interconnect layer and the second interconnect layer, provided to be adjacent to the first semiconductor layer in the first direction, and extending in the third direction;

a third charge storage layer provided between the first interconnect layer and the second semiconductor layer in the second direction; and a fourth charge storage layer provided between the second interconnect layer and the second semiconductor layer in the second direction.

11. The device according to claim 10, further comprising:
a fifth insulating layer in contact with the second semiconductor layer and the third and fourth charge storage layers;
a sixth insulating layer provided between the first interconnect layer and the third charge storage layer; and
a seventh insulating layer provided between the second interconnect layer and the fourth charge storage layer.

12. The device according to claim 10, further comprising:
a seventh interconnect layer provided to be adjacent to the second interconnect layer in the second direction, and extending in the first direction;
a third semiconductor layer provided between the second interconnect layer and the seventh interconnect layer, and extending in the third direction;
a fifth charge storage layer provided between the second interconnect layer and the third semiconductor layer in the second direction; and
a sixth charge storage layer provided between the seventh interconnect layer and the third semiconductor layer in the second direction.

13. The device according to claim 12, further comprising:
an eighth insulating layer in contact with the third semiconductor layer and the fifth and sixth charge storage layers;
a ninth insulating layer provided between the second interconnect layer and the fifth charge storage layer; and
a tenth insulating layer provided between the seventh interconnect layer and the sixth charge storage layer.

14. The device according to claim 12, wherein
a position of the third semiconductor layer is between a position of the first semiconductor layer and a position of the second semiconductor layer in the first direction, and the position of the third semiconductor layer is different from the positions of the first and second semiconductor layers in the second direction.

15. The device according to claim 3, further comprising:
an eleventh insulating layer including a side surface and a bottom surface that are in contact with the first insulating layer.

16. The device according to claim 3, wherein
an air gap is provided inside the first insulating layer.

17. The device according to claim 1, further comprising:
a twelfth insulating layer extending in the third direction, and including a side surface and a bottom surface that are in contact with the first semiconductor layer.

* * * * *